(12) United States Patent
Nagulu et al.

(10) Patent No.: US 11,349,186 B2
(45) Date of Patent: May 31, 2022

(54) MAGNETIC-FREE NON-RECIPROCAL CIRCUITS BASED ON SUB-HARMONIC SPATIO-TEMPORAL CONDUCTANCE MODULATION

(71) Applicant: The Trustees of Columbia University in the City of New York, New York, NY (US)

(72) Inventors: Aravind Nagulu, New York, NY (US); Harish Krishnaswamy, New York, NY (US)

(73) Assignee: The Trustees of Columbia University in the City of New York, New York, NY (US)

(*) Notice: Subject to any disclaimer, the term of this patent is extended or adjusted under 35 U.S.C. 154(b) by 0 days.

(21) Appl. No.: 17/288,155

(22) PCT Filed: Jan. 21, 2020

(86) PCT No.: PCT/US2020/014487
§ 371 (c)(1),
(2) Date: Apr. 23, 2021

(87) PCT Pub. No.: WO2020/150745
PCT Pub. Date: Jul. 23, 2020

(65) Prior Publication Data
US 2021/0384600 A1    Dec. 9, 2021

Related U.S. Application Data

(60) Provisional application No. 62/794,597, filed on Jan. 19, 2019.

(51) Int. Cl.
*H01P 1/32* (2006.01)
*H01P 1/383* (2006.01)
(Continued)

(52) U.S. Cl.
CPC .......... *H01P 1/383* (2013.01); *H03D 7/1466* (2013.01); *H04L 5/14* (2013.01)

(58) Field of Classification Search
CPC ...... H01P 1/32; H01P 1/36; H01P 1/38; H01P 1/383; H01P 1/387; H01P 1/393;
(Continued)

(56) References Cited

U.S. PATENT DOCUMENTS

| 4,639,622 A | 1/1987 | Goodwin et al. |
| 6,559,689 B1 | 5/2003 | Clark |

(Continued)

FOREIGN PATENT DOCUMENTS

| WO | WO 2006029286 | 8/2005 |
| WO | WO 2018052935 | 3/2018 |
| WO | WO 2018075113 | 4/2018 |

OTHER PUBLICATIONS

Abdelhalem, S.H., et al., "Tunable CMOS Integrated Duplexer with Antenna Impedance Tracking and High Isolation in the Transmit and Receive Bands", In IEEE Trans. Microw. Theory Techn., vol. 62, No. 9, Sep. 2014, pp. 2092-2104.

(Continued)

*Primary Examiner* — Stephen E. Jones
(74) *Attorney, Agent, or Firm* — Byrne Poh LLP

(57) ABSTRACT

A circuit comprising a differential transmission line and eight switches provides non-reciprocal signal flow. In some embodiments, the circuit can be driven by four local oscillator signals using a boosting circuit. The circuit can be used to form a gyrator. The circuit can be used to form a circulator. The circuit can be used to form three-port circulator than can provide direction signal flow between a transmitter and an antenna and from the antenna to a (Continued)

receiver. The three-port circulator can be used to implement a full duplex transceiver that uses a single antenna for transmitting and receiving.

17 Claims, 24 Drawing Sheets

(51) Int. Cl.
 *H03D 7/14* (2006.01)
 *H04L 5/14* (2006.01)
(58) Field of Classification Search
 CPC ...... H01P 1/397; H03D 7/165; H03D 7/1466; H04L 5/14
 See application file for complete search history.

(56) References Cited

U.S. PATENT DOCUMENTS

| | | | |
|---|---|---|---|
| 7,671,572 | B2 | 3/2010 | Chung |
| 8,339,183 | B2 | 12/2012 | Htoo et al. |
| 8,565,701 | B2 | 10/2013 | Sanchez et al. |
| 8,576,752 | B2 | 11/2013 | Sarca |
| 8,963,630 | B2 | 2/2015 | Ceballos et al. |
| 9,253,875 | B2 | 2/2016 | Lent et al. |
| 9,521,023 | B2 | 12/2016 | Martinez et al. |
| 9,847,865 | B2 | 12/2017 | Moher |
| 2006/0186948 | A1 | 8/2006 | Kelly et al. |
| 2011/0299431 | A1 | 12/2011 | Mikhemar et al. |
| 2014/0194074 | A1 | 7/2014 | Klomsdorf et al. |
| 2015/0065065 | A1 | 3/2015 | Rofougaran et al. |
| 2017/0005696 | A1 | 1/2017 | Sjoland |
| 2017/0207532 | A1 | 6/2017 | Wang |
| 2017/0257136 | A1 | 9/2017 | Gianvittorio et al. |
| 2017/0353210 | A1 | 12/2017 | Pratt et al. |
| 2019/0305397 | A1* | 10/2019 | Dinc ................ H03D 7/1441 |

OTHER PUBLICATIONS

Ahn, H.R., et al., "New Isolation Circuits of Compact Impedance-Transforming 3-dB Baluns for Theoretically Perfect Isolation and Matching", In IEEE Transactions on Microwave Theory and Techniques, vol. 58, No. 12, Nov. 2010, pp. 3892-3902.
Allen, P., "The Turnstile Circulator", In IRE Trans. Microw. Theory Techn., vol. 4, No. 4, Oct. 1956, pp. 223-227.
Andrews, C. and Molnar, A.C., "A Passive Mixer-First Receiver with Digitally Controlled and Widely Tunable RF Interface", In IEEE Journal of Solid-State Circuits, vol. 45, No. 12, Dec. 2010, pp. 2696-2708.
Bahamonde, J. et al., "A Non-Reciprocal Surface Acoustic Wave Filter Based on Asymmetrical Delay Lines and Parametric Interactions", in Proceedings of 2020 IEEE 33rd International Conference on Micro Electro Mechanical Systems, Jan. 18-22, 2020, Vancouver, Canada, pp. 1250-1253.
Bahamonde, J. et al., "A Reconfigurable Surface Acoustic Wave Filter on ZnO/AlGaN/GaN Heterostructure", in IEEE Transactions on Electron Devices, vol. 67, issue 10, Sep. 14, 2020, pp. 4507-4514.
Bahamonde, J. et al., "A Tunable Surface Acoustic Wave Device on Zinc Oxide via acoustoelectric interaction with AlGaN/GaN 2DEG", in Proceedings of 2019 Device Research Conference, Jun. 23-26, 2019, Ann Arbor, MI, pp. 111-112.
Bahamonde, J. et al., "Acoustoelectric amplification of surface acoustic waves on ZnO deposited on AlGaN/GaN Epi", in Proceedings of 2017 75th Annual Device Research Conference, Jun. 25-28, 2017, South Bend, IN, pp. 1-2.
Baldwin, L., "Nonreciprocal Parametric Amplifier Circuits", In Proc. of the Inst. Radio Eng., vol. 49, No. 6, Jan. 1961, pp. 1075.
Bharadia, D., et al., "Full Duplex Radios", In Proc. of the ACM SIGCOMM Conf., Aug. 2013, pp. 375-386.
Biedka, M.M., et al., "Ultra-Wide Band Nonreciprocity through Sequentially-Switched Delay Lines", In Sci. Rep., vol. 7, art. No. 40014, Jan. 2017, pp. 1-16.
Bosma, H., "On Stripline Y-Circulation at UHF", In IEEE Trans. Microw. Theory Techn., vol. 12, No. 1, Jan. 1964, pp. 61-72.
Bult, K., "Analog Design in Deep Sub-Micron CMOS", In Proceedings of the European Solid-State Circuits Conference, Sep. 2000, pp. 11-17.
Carchon, G. and Nauwelaers, B., "Power and Noise Limitations of Active Circulators", In IEEE Trans. Microw. Theory Techn., vol. 48, No. 2, Feb. 2000, pp. 316-319.
Chandrakasan, A.P., et al., "Low-Power CMOS Digital Design", In IEEE Journal of Solid-State Circuits, vol. 27, No. 4, Apr. 1992, pp. 1-12.
Chang, D.Y. and Moon, U.K., "A 1.4—V 10—Bit 25—MS/s Pipelined ADC Using Opamp-Reset Switching Technique", In IEEE Journal of Solid-State Circuits, vol. 38, No. 8, Jul. 2003, pp. 1401-1404.
Choi, J.I., et al., "Achieving Single Channel, Full-Duplex Wireless Communication", In Proc. of the 16th Annu. Int. Conf. Mobile Comput. Netw., Sep. 2010, pp. 1-12.
Colon-Berrios, A. et al., "Improved Cyclohexanone Vapor Detection via Gravimetric Sensing", in Journal of Microelectromechanical Systems, vol. 29, issue 5, Jul. 29, 2020, pp. 1-10.
Dastjerdi, M.B., et al., "Full Duplex Circulator-Receiver Phased Array Employing Self-Interference Cancellation via Beamforming", In Proc. of the IEEE Radio Freq. Integr. Circuits Symp., Jun. 2018, pp. 108-111.
Debaillie, B., et al., "Analog/RF Solutions Enabling Compact Full-Duplex Radios", In IEEE J. of Sel. Areas Commun., vol. 32, No. 9, Sep. 2014, pp. 1662-1673.
Desai, N.V., et al., "An Actively Detuned Wireless Power Receiver with Public Key Cryptographic Authentication and Dynamic Power Allocation", In IEEE Journal of Solid-State Circuits, vol. 53, No. 1, Sep. 2017, pp. 236-246.
Dine et al., "Millimeter-wave full-duplex wireless: Applications, antenna interfaces and systems", in Proceedings of 2017 IEEE Custom Integrated Circuits Conference, Apr. 30-May 3, 2017, Austin, TX, pp. 1-8.
Dine, T. et al., "17.2 A 28GHz magnetic-free non-reciprocal passive CMOS circulator based on spatio-temporal conductance modulation", in Proceedings of 2017 IEEE International Solid-State Circuits Conference, Feb. 5-9, 2017, San Francisco, CA, pp. 294-296.
Dine, T., et al., "A 60 GHz CMOS Full-Duplex Transceiver and Link with Polarization-Based Antenna and RF Cancellation", In IEEE J. of Solid-State Circuits, vol. 51, No. 5, May 2016, pp. 1125-1140.
Dine, T., et al., "A Millimeter-Wave Non-Magnetic Passive Soi Cmos Circulator Based on Spatio-Temporal Conductivity Modulation", In IEEE Journal of Solid-State Circuits, vol. 52, No. 12, Dec. 2017, pp. 3276-3292.
Dine, T., et al., "Synchronized Conductivity Modulation to Realize Broadband Lossless Magnetic-Free Non-Reciprocity", In Nature Commun., vol. 8, Oct. 2017, p. 765.
Dokic, B.L., et al., "Low-Voltage Low-Power CMOS Design", In Proceedings of the 2016 Symposium on Industrial Electronics, Nov. 2016, pp. 1-6.
Elkholy, M., et al., "Low-Loss Integrated Passive CMOS Electrical Balance Duplexers with Single-Ended LNA", In IEEE Trans. Microw. Theory Techn., vol. 64, No. 5, May 2016, pp. 1544-1559.
Esser, D., et al., "Improved Antenna Isolation in Transmit/Receive Applications", In Proceedings of the German Microwave Conference, Mar. 2006, pp. 1-5.
Estep, N.A., et al., "Magnetic-Free Non-Reciprocity and Isolation Based on Parametrically Modulated Coupled-Resonator Loops", In Nature Phys., vol. 10, No. 12, Nov. 2014, pp. 923-927.
Estep, N.A., et al., "Magnetless Microwave Circulators Based on Spatiotemporally Modulated Rings of Coupled Resonators", In IEEE Trans. Microw. Theory Techn., vol. 64, No. 2, Feb. 2016, pp. 502-518.
Fan, L., et al., "An All-Silicon Passive Optical Diode", In Science, vol. 335, Jan. 2012, pp. 447-450.

(56) References Cited

OTHER PUBLICATIONS

Fayomi, C.J.B. and Roberts, G.W., "Design and Characterization of Low-Voltage Analog Switch Without the Need for Clock Boosting", In Proceedings of the 47th Midwest Symposium on Circuits and Systems, Jul. 2004, pp. 1-4.
Gallo, K., et al., "All-Optical Diode in a Periodically Poled Lithium Niobate Waveguide", In Appl. Phys. Lett., vol. 79, No. 3, Jul. 2001, pp. 314-316.
Hamasaki, J., "A Theory of a Unilateral Parametric Amplifier Using Two Diodes", In Bell Syst. Tech. J., vol. 43, No. 3, May 1964, pp. 1123-1147.
International Preliminary Report on Patentability dated Jul. 29, 2021 in International Patent Application No. PCT/US2020/014487, pp. 1-8.
International Preliminary Reporton Patentability dated Dec. 15, 2020 in International Patent Application No. PCT/US2019/036628, pp. 1-6.
International Search Report and Written Opinion dated Jan. 30, 2020 in International Patent Application No. PCT/US2019/036628, pp. 1-11.
International Search Report and Written Opinion dated Apr. 8, 2020 in International Patent Application No. PCT/US2020/014487, pp. 1-12.
Kamal, A.K., "A Parametric Device as a Nonreciprocal Element", In Proc. of the IRE, vol. 48, No. 8, Aug. 1960, pp. 1424-1430.
Keskin, M., "A Low-Voltage CMOS Switch with a Novel Clock Boosting Scheme", In IEEE Transactions on Circuits and Systems II: Express Briefs, vol. 54, No. 4, Jul. 2005, pp. 185-188.
Koochakzadeh, M. and Abbaspour-Tamijani, A., "Miniaturized Transmission Lines Based on Hybrid Lattice-Ladder Topology", In IEEE Trans. Microw. Theory Techn., vol. 58, No. 4, Apr. 2010, pp. 949-955.
Kord, A., et al., "Broadband Cyclic-Symmetric Magnetless Circulators and Theoretical Bounds on their Bandwidth", In IEEE Trans. Microw. Theory Techn., vol. 66, No. 12, Dec. 2018, pp. 5472-5481.
Kord, A., et al., "Low-Loss Broadband Magnetless Circulators for Full-Duplex Radios", In IEEE/MTT-S Int. Microw. Symp. Tech. Dig., Jun. 2018, pp. 506-509.
Korpi, D., et al., "Full-Duplex Mobile Device: Pushing the Limits", In IEEE Commun. Mag., vol. 54, No. 9, Sep. 2016, pp. 80-87.
Kumar, S., et al., "An Ultra-Low Power CMOS DC-DC Buck Converter with Double-Chain Digital PWM Technique", In Journal of Analog Integrated Circuits and Signal Processing, vol. 92, No. 1, Jul. 2017, pp. 141-149.
Lim, W.G., et al., "Transmitter and Receiver Isolation by Concentric Antenna Structure", In IEEE Transactions on Antennas and Propagation, vol. 58, No. 10, Jul. 2010, pp. 3182-3188.
Mikhemar, M., et al., "A Multiband RF Antenna Duplexer on CMOS: Design and Performance", In IEEE Journal of Solid-State Circuits, vol. 48, No. 9, Sep. 2013, pp. 2067-2077.
Molnar, A. et al., "Synthetic Diversity to Mitigate Out-of-Band Interference in Widely Tunable Wireless Receivers", in Proceedings of 2019 53rd Asilomar Conference on Signals, Systems, and Computers, Nov. 3-6, 2019, Pacific Grove, CA, pp. 774-778.
Nagulu, A. et al., "Non-reciprocal electronics based on temporal modulation", in Nature Electronics, May 4, 2020, pp. 241-250.
Nagulu, A. et al., "Ultra Compact, Ultra Wideband, DC-1GHz CMOS Circulator Based on Quasi-Electrostatic Wave Propagation in Commutated Switched Capacitor Networks", in Proceedings of 2020 IEEE Radio Frequency Integrated Circuits Symposium, Aug. 4-6, 2020, Los Angeles, CA, pp. 55-58.
Nagulu, A., et al., "Fully-Integrated Nonmagnetic 180 nm SOI Circulator with > 1W P1 dB, > +50 dBm IIP3 and High Isolation Across 1.85 VSWR", In Proc. of the IEEE Radio Freq. Integr. Circuits Symp., Jun. 2018, pp. 104-107.
Nagulu, A., et al., "Nonreciprocal Components based on Switched Transmission Lines", In IEEE Trans. Microw. Theory Techn., vol. 66, No. 11, Nov. 2018, pp. 4706-4725.
Notice of Allowance dated Aug. 20, 2021 in U.S. Appl. No. 17/255,679, pp. 2-4.

Oh, T., et al., "A Low-Power CMOS Piezoelectric Transducer Based Energy Harvesting Circuit for Wearable Sensors for Medical Applications", In Journal of Low Power Electronics and Applications, vol. 7, No. 33, Dec. 2017, pp. 1-11.
Peng, B., et al., "Parity—Time-Symmetric Whispering-Gallery Microcavities", In Nature Phys., vol. 10, Apr. 6, 2014, pp. 394-398.
Qi, G., et al., "A SAW-Less Tunable RF Front End for FDD and IBFD Combining an Electrical-Balance Duplexer and a Switched-LCN-Path LNA", In IEEE Journal of Solid-State Circuits, vol. 53, No. 5, May 2018, pp. 1431-1442.
Qin, S., et al., "Nonreciprocal Components with Distributedly Modulated Capacitors", In IEEE Trans. Microw. Theory Techn., vol. 62, No. 10, Oct. 2014, pp. 2260-2272.
Reiskarimian, N. and Krishnaswamy, H., "Magnetic-Free Non-Reciprocity based on Staggered Commutation", In Nature Commun., vol. 7, art. No. 11217, Apr. 2016, pp. 1-10.
Reiskarimian, N. et al., "RFIC Inductorless, Widely-Tunable N-Path Shekel Circulators Based on Harmonic Engineering", in Proceedings of 2020 IEEE Radio Frequency Integrated Circuits Symposium, Aug. 4-6, 2020, Los Angeles, CA, pp. 39-42.
Reiskarimian, N., et al., "A Cmos Passive LPTV Nonmagnetic Circulator and its Application in a Full-Duplex Receiver", In IEEE J. of Solid-State Circuits, vol. 52, No. 5, May 2017, pp. 1358-1372.
Reiskarimian, N., et al., "Analysis and Design of Commutation-Based Circulator-Receivers for Integrated Full-Duplex Wireless", In IEEE J. of Solid-State Circuits, vol. 53, No. 8, Aug. 2018, pp. 2190-2201.
Reiskarimian, N., et al., "Integrated Conductivity-Modulation-Based RF Magnetic-Free Nonreciprocal Components: Recent Results and Benchmarking", In IEEE Antennas Wireless Propag. Lett., vol. 17, No. 11, Nov. 2018, pp. 1978-1982.
Sabharwal, A., et al., "In-Band Full-Duplex Wireless: Challenges and Opportunities", In IEEE J. of Sel. Areas Commun., vol. 32, No. 9, Sep. 2014, pp. 1637-1652.
Sounas, D., et al., "Broadband Passive Isolators Based on Coupled Nonlinear Resonances", In Nature Electron., vol. 1, Feb. 2008, pp. 113-119.
Tanaka, S., et al., "Active Circulators—The Realization of Circulators Using Transistors", In Proc. of the IEEE, vol. 53, No. 3, Mar. 1965, pp. 260-267.
Tapen, T. et al., "An Integrated, Software-Defined FDD Transceiver: Distributed Duplexing Theory and Operation", in IEEE Transactions on Circuits and Systems I: Regular Papers, vol. 67, issue 1, Dec. 12, 2019, pp. 271-283.
Tapen, T. et al., "The Impact of LO Phase Noise in N-Path Filters", in IEEE Transactions on Circuits and Systems I: Regular Papers, vol. 65, issue 5, Oct. 20, 2017, pp. 1481-1494.
Tellegen, B.D.H., "The Gyrator, a New Electric Network Element", In Philips Res. Rep., vol. 3, No. 2, Apr. 1948, pp. 81-101.
Tyagi, S., et al., "An Advanced Low Power, High Performance, Strained Channel 65nm Technology", In IEDM Tech. Dig., Dec. 2005, pp. 245-247.
Van den Broek, D.J., et al., "An In-Band Full-Duplex Radio Receiver with a Passive Vector Modulator Downmixer for Self-Interference Cancellation", In IEEE Journal of Solid-State Circuits, vol. 50, No. 12, Dec. 2015, pp. 3003-3014.
Van Liempd, B., et al., "2.2 A +70 dBm IIP3 Single-Ended Electrical-Balance Duplexer in 0.18 μm SOI CMOS", In IEEE ISSCC Dig. Tech. Papers, San Francisco, CA, US, Feb. 22-26, 2015, pp. 1-3.
Van Liempd, B., et al., "Adaptive RF Front-Ends Using Electrical-Balance Duplexers and Tuned Saw Resonators", In IEEE Trans. Microw. Theory Techn., vol. 65, No. 11, Nov. 2017, pp. 4621-4628.
Van Liempd, B., et al., "An Electrical-Balance Duplexer for In-Band Full-Duplex with <-85 dBm In-Band Distortion at +10 dBm TX-Power", In Proceedings of the 41st European Solid-State Circuits Conference, Sep. 2015, pp. 176-179.
Wang, S., et al., "Fully Integrated 10-GHz Active Circulator and Quasi-Circulator Using Bridged-T Networks in Standard CMOS", In IEEE Trans. Very Large Scale Integr. Syst., vol. 24, No. 10, Oct. 2016, pp. 3184-3192.

(56) References Cited

OTHER PUBLICATIONS

Yang, D., et al., "A Wideband Highly Integrated and Widely Tunable Transceiver for In-Band Full-Duplex Communication", In IEEE Journal of Solid-State Circuits, vol. 50, No. 5, May 2015, pp. 1189-1202.

Yuksel, H., et al., "An FDD/FD Capable, Single Antenna RF Front End from 800MHz to 1.2GHz w/ Baseband Harmonic Predistortion", in Proceedings of 2018 IEEE Radio Frequency Integrated Circuits Symposium, Jun. 10-12, 2018, Philadelphia, PA, pp. 120-123.

Zhang, T., et al., "Wideband Dual-Injection Path Self-Interference Cancellation Architecture for Full-Duplex Transceivers", In IEEE Journal of Solid-State Circuits, vol. 53, No. 5, Jun. 2018, pp. 1563-1576.

Zhou, J., et al., "Integrated Full Duplex Radios", In IEEE Commun. Mag., vol. 55, No. 4, Apr. 2017, pp. 142-151.

* cited by examiner

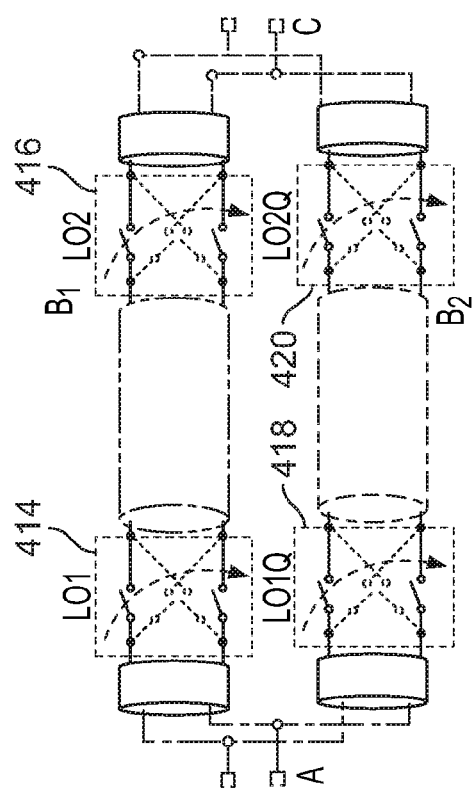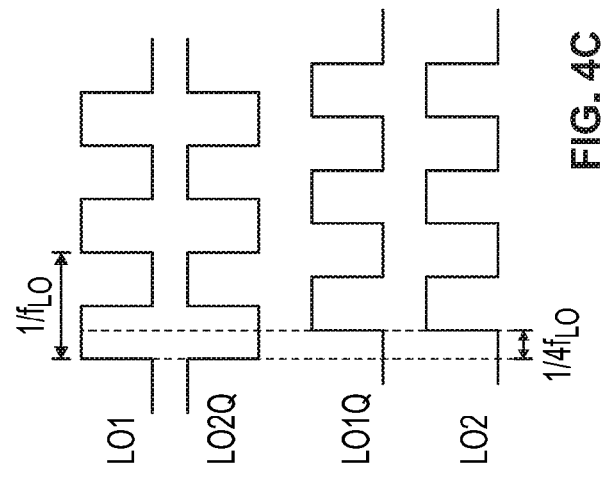

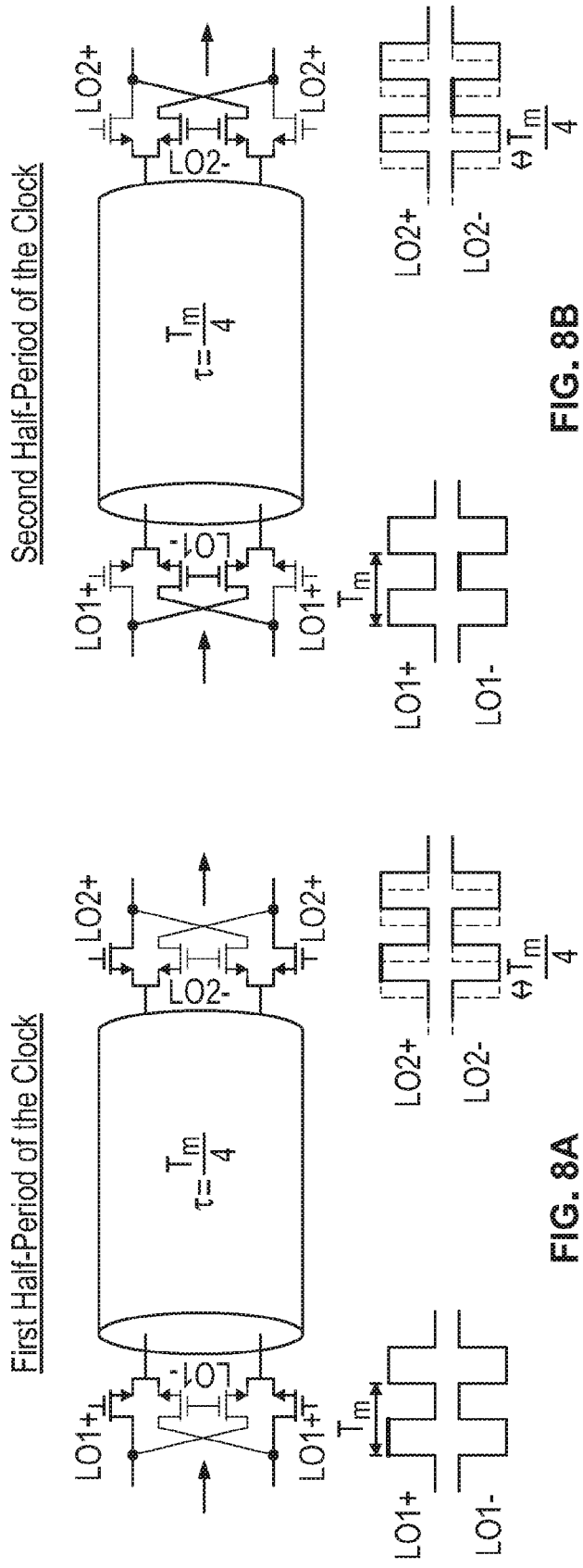

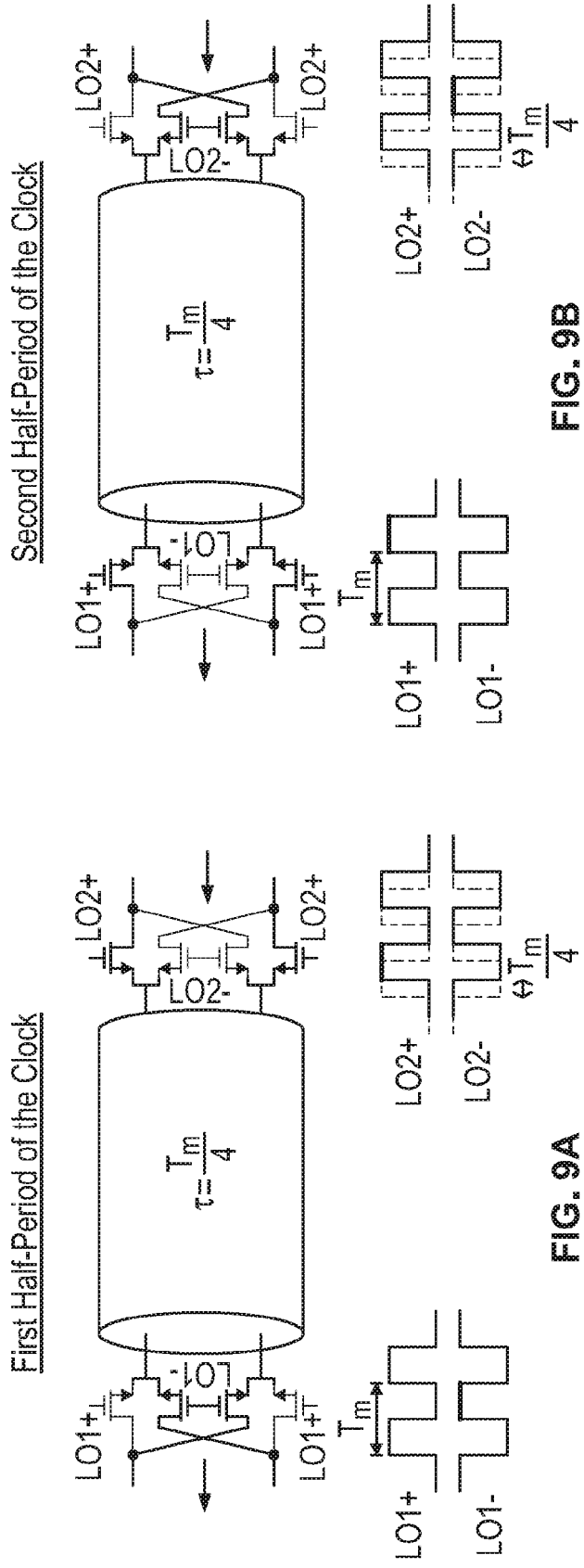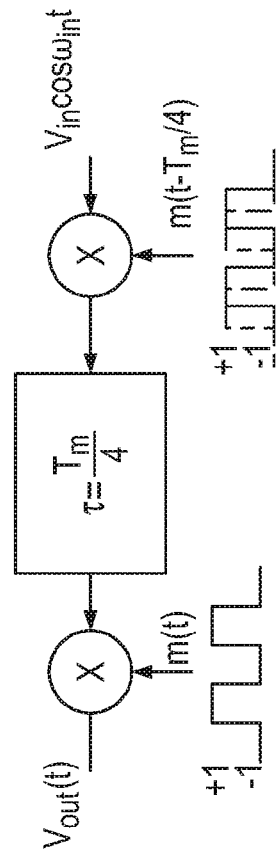
FIG. 9A
FIG. 9B
FIG. 9C

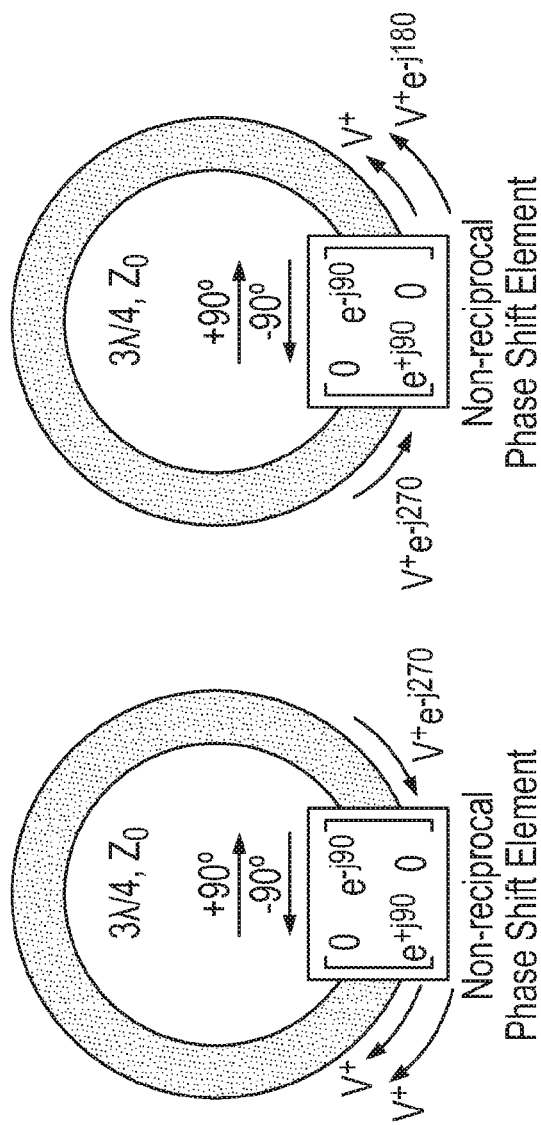
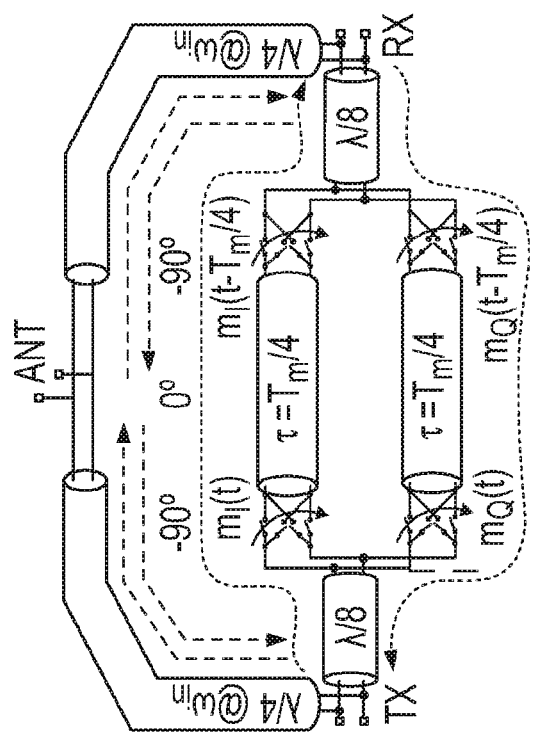
FIG. 12A
FIG. 12B

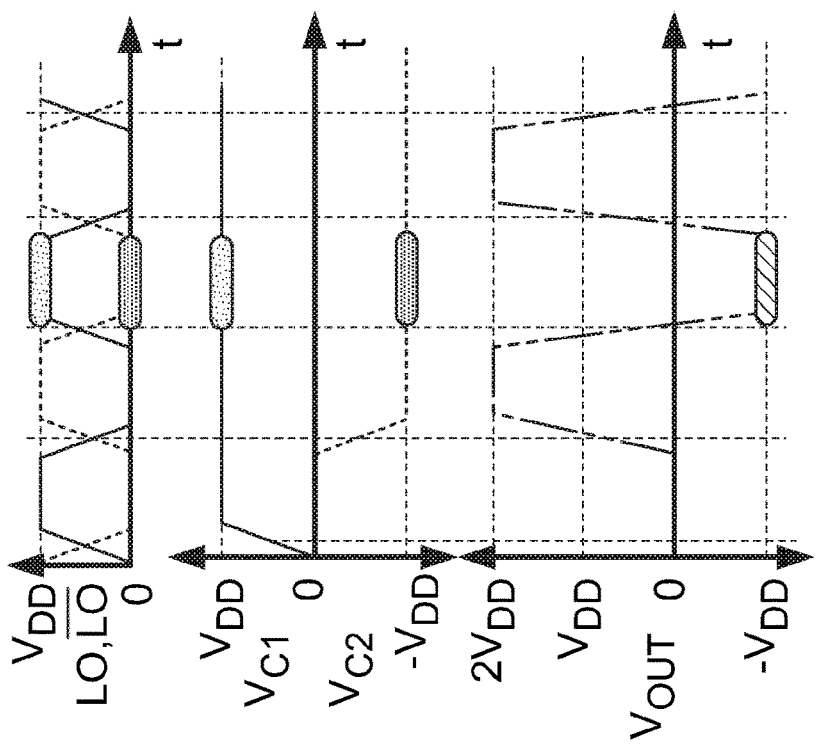
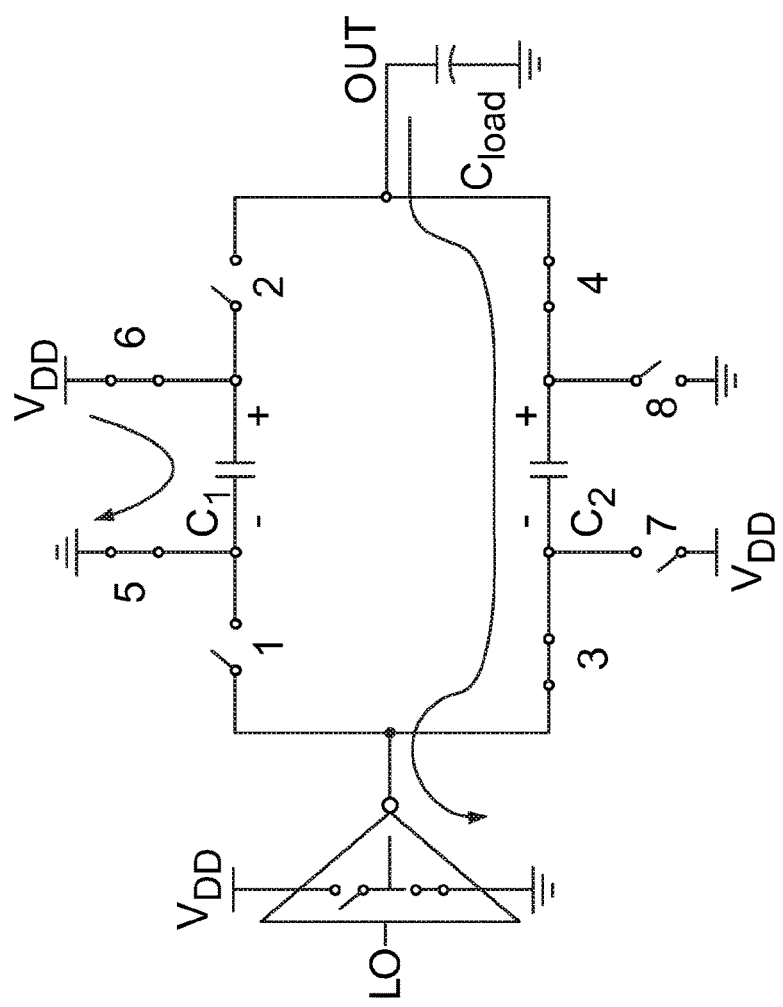
FIG. 17

| Q of gyrator | Q @ 10 GHz | Q @ 30 GHz | Q @ 50 GHz | Q @ 70 GHz |
|---|---|---|---|---|
| Zg = 50 | 0 | 0 | 0 | 0 |
| Zg = 10 | 1.83 | 5.5 | 9.15 | 12.8 |
| Zg = 5 | 3.87 | 11.6 | 19.3 | 27 |
| Zg = 2 | 9.8 | 28.4 | 48.9 | 68.3 |
| Zg = 1 | 19.6 | 58.89 | 97.8 | 136.4 |

FIG. 22

MAGNETIC-FREE NON-RECIPROCAL CIRCUITS BASED ON SUB-HARMONIC SPATIO-TEMPORAL CONDUCTANCE MODULATION

CROSS REFERENCE TO RELATED APPLICATION

This application claims the benefit of U.S. Provisional Patent Application No. 62/794,597, filed Jan. 19, 2019, which is hereby incorporated by reference herein in its entirety.

STATEMENT REGARDING GOVERNMENT FUNDED RESEARCH

This invention was made with government support under HR0011-17-2-0007 awarded by DOD/DARPA. The government has certain rights in the invention.

BACKGROUND

Full-duplex communications, in which a transmitter and a receiver of a transceiver operate simultaneously on the same frequency band, is drawing significant interest for emerging 5G communication networks due to its potential to double network capacity compared to half-duplex communications. Additionally, there are several efforts underway to include simultaneous transmit and receive functionality in the next generation phased array radar systems, especially in commercial automotive radars which can be an enabler technology for future connected or driverless cars. However, one of the biggest challenges from an implementation perspective is the antenna interface.

One way in which an antenna interface for a full-duplex transceiver can be implemented is using a non-reciprocal circulator. Reciprocity in electronics is a fundamental property of linear systems and materials described by symmetric and time-independent permittivity and permeability tensors. Non-reciprocity causes signals to travel in only one direction. For example, non-reciprocity in a circulator causes signals to travel in only one direction through the circulator. This directional signal flow enables full-duplex wireless communications because signals from the transmitter are only directed toward the antenna (and not the receiver) and received signals at the antenna are only directed toward the receiver (and not the transmitter). Moreover, the receiver is isolated from signals from the transmitter, preventing desensitization and possible breakdown of the receiver due to the high-power transmitted signal.

Conventionally, non-reciprocal circulators have been implemented using ferrite materials, which are materials that lose their reciprocity under the application of an external magnetic field. However, ferrite materials cannot be integrated into CMOS IC technology. Furthermore, the need for an external magnet renders ferrite-based circulators bulky and expensive.

Accordingly, new mechanisms for implementing non-reciprocity in circuits is desirable.

SUMMARY

In accordance with some embodiments, magnetic-free non-reciprocal circuits based on sub-harmonic spatio-temporal conductance modulation are provided. In some embodiments, circuits are provided, the circuits comprising: a first differential transmission line having: a first end having a first connection and a second connection; and a second end having a third connection and a fourth connection; a first switch having a first side, a second side, and a control, wherein the first side of the first switch is connected to the first connection; a second switch having a first side, a second side, and a control, wherein the first side of the second switch is connected to the first connection; a third switch having a first side, a second side, and a control, wherein the first side of the third switch is connected to the second connection and the second side of the third switch is connected to the second side of the first switch and a first node; a fourth switch having a first side, a second side, and a control, wherein the first side of the fourth switch is connected to the second connection and the second side of the fourth switch is connected to the second side of the second switch and a second node; a fifth switch having a first side, a second side, and a control, wherein the first side of the fifth switch is connected to the third connection; a sixth switch having a first side, a second side, and a control, wherein the first side of the sixth switch is connected to the third connection; a seventh switch having a first side, a second side, and a control, wherein the first side of the seventh switch is connected to the fourth connection and the second side of the seventh switch is connected to the second side of the fifth switch and a third node; an eighth switch having a first side, a second side, and a control, wherein the first side of the eighth switch is connected to the fourth connection and the second side of the eighth switch is connected to the second side of the sixth switch and a fourth node; and at least one boosting circuit that, in response to a modulation signal drives the control of at least one of the control of the first switch, the control of the second switch, the control of the third switch, the control of the fourth switch, the control of the fifth switch, the control of the sixth switch, the control of the seventh switch, and the control of the eighth switch with a drive signal.

BRIEF DESCRIPTION OF THE DRAWINGS

FIGS. 4A, 4B, and 4C is an example of the operation of switch groups in accordance with some embodiments.

FIGS. 8A, 8B, and 8C are examples of the operation of the element of FIG. 7 with a signal propagating from left to right in accordance with some embodiments.

FIGS. 9A, 9B, and 9C are examples of the operation of the element of FIG. 7 with a signal propagating from right to left in accordance with some embodiments.

FIG. 12A is an example of a block diagram of a non-reciprocal circulator in accordance with some embodiments.

FIG. 12B is an example of a block diagram of a three port non-reciprocal circulator in accordance with some embodiments.

FIG. 17 also illustrates an example of the operation of a boosting circuit in accordance with some embodiments.

FIG. 22 illustrates an example of table showing Q values for a gyrator with impedance mismatches at different frequencies in accordance with some embodiments.

DETAILED DESCRIPTION

FIGS. 1A, 1B, 1C, and 1D show an example of how a non-reciprocal phase shift can be implemented in some embodiments.

Figure 1C:
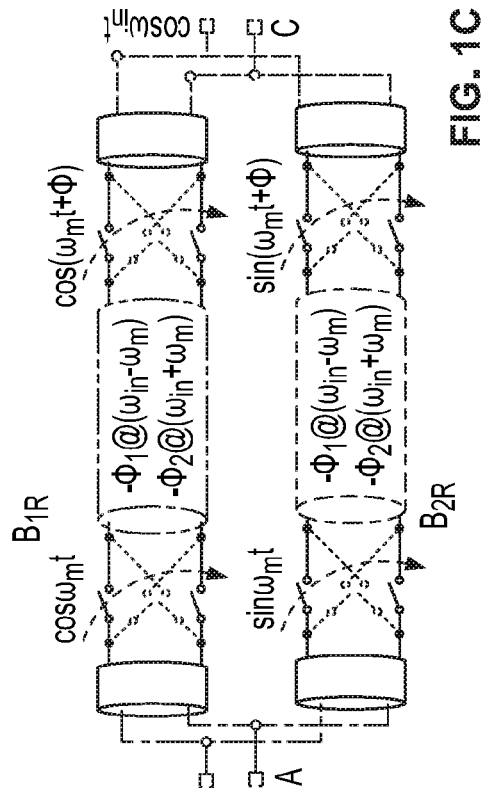
FIGS. 1A, 1B, 1C, and 1D are example illustrations of how a non-reciprocal phase shift can be implemented in accordance with some embodiments.
Figure 1D:
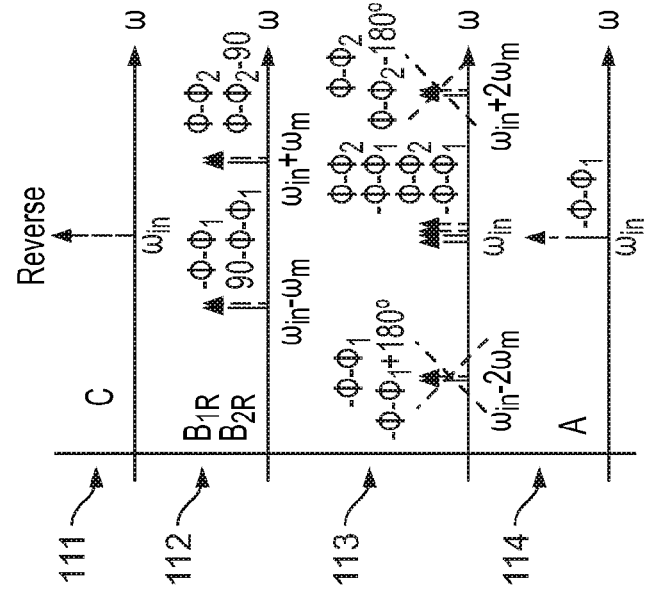
Figure 1A:
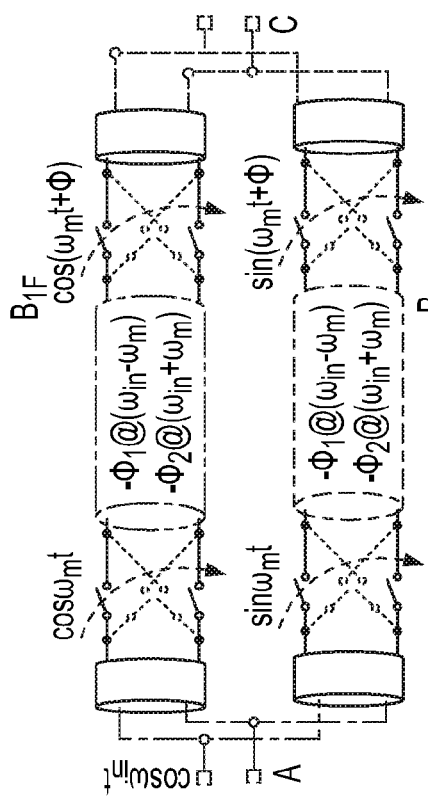
Figure 1B:
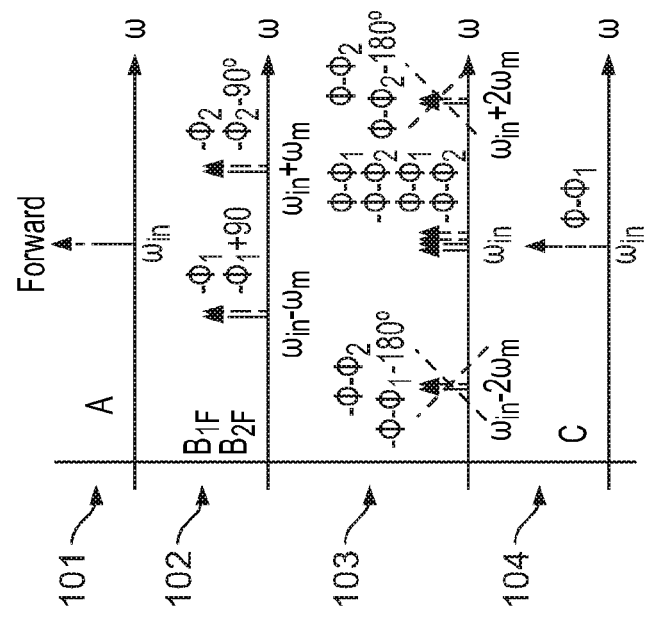

Turning to FIG. 1A, it can be seen that a signal $\cos(\omega_{in}t)$ can be injected at nodes A. This is represented in graph 101 of FIG. 1B. As shown in FIG. 1A, the switch groups can then be switched by the following signals: $\cos(\omega_m t)$; $\cos(\omega_m t+\Phi)$; $\sin(\omega_m t)$; and $\sin(\omega_m t+\Phi)$, where $\Phi$ is 90°. $\Phi_1$ and $\Phi_2$ shown in FIGS. 1A and 1B relate to $\Phi$ according to the following equation: $2\Phi=180=\Phi_1-\Phi_2$ (or equivalently, $2*Td*\omega_m/\pi=1$ where Td is the delay of the transmission lines). As a result of the switching at the switch groups closest to nodes A, the input signal is commutated and two mixing products appear after the commutation on each transmission line at $\omega_{in}-\omega_m$ and $\omega_{in}+\omega_m$. These signals then flow through the top and bottom transmission lines (which provide $-\Phi_1$ and $-\Phi_2$ phase shifts at $\omega_{in}-\omega_m$ and $\omega_{in}+\omega_m$, respectively). The mixing tones flowing through the top transmission line appear at node $B_{1F}$ with total phase shifts of $-\Phi_1$ and $-\Phi_2$ at $\omega_{in}-\omega_m$ and $\omega_{in}+\omega_m$, respectively. The mixing tones flowing through the bottom line appear at node $B_{2F}$ with total phase shifts of $-\Phi_1+90°$ and $-\Phi_2-90°$) at $\omega_{in}-\omega_m$ and $\omega_{in}+\omega_m$, respectively. This is shown in graph 102 of FIG. 1B. The phase shifted signals are then commutated again at $\omega_m$, by the switch groups closest to nodes C, but with a phase shift of $\Phi$. For each of the four signals in graph 102, two mixing products appear after the commutation at nodes C (for a total of eight signals). As shown in graph 103 of FIG. 1B, the mixing products appear at $\omega_{in}-2\omega_m$, $\omega_{in}$, and $\omega_{in}+2\omega_m$ with phase shifts as shown in the following table:

| Row | Signal in Graph 102 | Mixing Product | Resulting Frequency | Resulting Phase Shift |
|---|---|---|---|---|
| 1 | $\omega_{in} - \omega_m, -\Phi_1$ | 1 | $\omega_{in} - 2\omega_m$ | $-\Phi - \Phi_1$ |
| 2 | $\omega_{in} - \omega_m, -\Phi_1$ | 2 | $\omega_{in}$ | $\Phi - \Phi_1$ |
| 3 | $\omega_{in} + \omega_m, -\Phi_2$ | 1 | $\omega_{in}$ | $-\Phi - \Phi_2 = \Phi - \Phi_1$ |
| 4 | $\omega_{in} + \omega_m, -\Phi_2$ | 2 | $\omega_{in} + 2\omega_m$ | $\Phi - \Phi_2$ |
| 5 | $\omega_{in} - \omega_m, -\Phi_1 + 90°$ | 1 | $\omega_{in} - 2\omega_m$ | $-\Phi - \Phi_1 + 180°$ |
| 6 | $\omega_{in} - \omega_m, -\Phi_1 + 90°$ | 2 | $\omega_{in}$ | $\Phi - \Phi_1$ |
| 7 | $\omega_{in} + \omega_m, -\Phi_2 - 90°$ | 1 | $\omega_{in}$ | $-\Phi - \Phi_2 = \Phi - \Phi_1$ |
| 8 | $\omega_{in} + \omega_m, -\Phi_2 - 90°$ | 2 | $\omega_{in} + 2\omega_m$ | $\Phi - \Phi_2 - 180°$ |

As can be seen, the signals at $\omega_{in}-2\omega_m$ and $\omega_{in}+2\omega_m$ (in rows 1 and 5 and rows 4 and 8, respectively) are 180° out of phase and thus cancel out. Also, the signals at $\omega_{in}$ (in rows 2, 3, 6, and 7) all have the same phase, and thus add up into a single signal with a phase shift of $\Phi-\Phi_1$, or $90°-\Phi_1$. This is shown in graph 104 of FIG. 1B.

Turning to FIG. 1C, it can be seen that a signal $\cos(\omega_{in}t)$ can be injected at nodes C. This is represented in graph 111 of FIG. 1D. As shown in FIG. 1C, the switch groups are switched by the following signals: $\cos(\omega_m t)$; $\cos(\omega_m t+\Phi)$; $\sin(\omega_m t)$; and $\sin(\omega_m t+\Phi)$, where $\Phi$ is 90°. $\Phi_1$ and $\Phi_2$ shown in FIGS. 1C and 1D relate to $\Phi$ according to the following equation: $2\Phi=180=\Phi_1-\Phi_2$ (or equivalently, $2*Td*\omega_m/\pi=1$ where Td is the delay of the transmission lines). As a result of the switching at the switch groups closest to nodes C, the input signal is commutated and two mixing products appear after the commutation on each transmission line at $\omega_{in}-\omega_m$ (with phase shifts of $-\Phi$) and $\Phi_{in}+\omega_m$ (with phase shifts of $\Phi$). These signals then flow through the top and bottom transmission lines (which provide $-\Phi_1$ and $-\Phi_2$ phase shifts at $\omega_{in}-\omega_m$ and $\omega_{in}+\omega_m$, respectively). The mixing tones flowing through the top transmission line appear at node $B_{1R}$ with total phase shifts of $-\Phi-\Phi_1$ and $\Phi-\Phi_2$ at $\omega_{in}-\omega_m$ and $\omega_{in}+\omega_m$, respectively. The mixing tones flowing through the bottom line appear at node $B_{2R}$ with total phase shifts of $90°-\Phi-\Phi_1$ and $-90°+\Phi_1-\Phi_2$ at $\omega_{in}-\omega_m$ and $\omega_{in}+\omega_m$, respectively. This is shown in graph 112 of FIG. 1D. The phase shifted signals are then commutated again at $\omega_m$, by the switch groups closest to nodes A. For each of the four signals in graph 112, two mixing products appear after the commutation at nodes A (for a total of eight signals). As shown in graph 113 of FIG. 1D, the mixing products appear at $\omega_{in}-2\omega_m$, $\omega_{in}$, and $\omega_{in}+2\omega_m$ with phase shifts as shown in the following table:

| Row | Signal in Graph 112 | Mixing Product | Resulting Frequency | Resulting Phase Shift |
|---|---|---|---|---|
| 1 | $\omega_{in} - \omega_m, -\Phi - \Phi_1$ | 1 | $\omega_{in} - 2\omega_m$ | $-\Phi - \Phi_1$ |
| 2 | $\omega_{in} - \omega_m, -\Phi - \Phi_1$ | 2 | $\omega_{in}$ | $-\Phi - \Phi_1$ |
| 3 | $\omega_{in} + \omega_m, \Phi - \Phi_2$ | 1 | $\omega_{in}$ | $\Phi - \Phi_2 = -\Phi - \Phi_1$ |
| 4 | $\omega_{in} + \omega_m, \Phi - \Phi_2$ | 2 | $\omega_{in} + 2\omega_m$ | $\Phi - \Phi_2$ |

-continued

| Row | Signal in Graph 112 | Mixing Product | Resulting Frequency | Resulting Phase Shift |
|---|---|---|---|---|
| 5 | $\omega_{in} - \omega_m$, $90° - \Phi - \Phi_1$ | 1 | $\omega_{in} - 2\omega_m$ | $-\Phi - \Phi_1 + 180°$ |
| 6 | $\omega_{in} - \omega_m$, $90° - \Phi - \Phi_1$ | 2 | $\omega_{in}$ | $-\Phi - \Phi_1$ |
| 7 | $\omega_{in} + \omega_m$, $\Phi - \Phi_2 - 90°$ | 1 | $\omega_{in}$ | $\Phi - \Phi_2 = -\Phi - \Phi_1$ |
| 8 | $\omega_{in} + \omega_m$, $\Phi - \Phi_2 - 90°$ | 2 | $\omega_{in} + 2\omega_m$ | $\Phi - \Phi_2 - 180°$ |

As can be seen, the signals at $\omega_{in}-2\omega_m$ and $\omega_{in}+2\omega_m$ (in rows 1 and 5 and rows 4 and 8, respectively) are 180° out of phase and thus cancel out. Also, the signals at $\omega_{in}$ (in rows 2, 3, 6, and 7) all have the same phase, and thus add up into a single signal with a phase shift of $-\Phi-\Phi_1$, or $-90°-\Phi_1$. This is shown in graph 114 of FIG. 1D.

As can be seen in FIGS. 1C and 1D, the signals at $\omega_{in}$ incur different phase shifts in the forward and reverse direction ($\Phi-\Phi_1$ and $-\Phi-\Phi_1$, respectively), demonstrating the phase non-reciprocity.

The scattering parameter matrix of the configuration shown in FIGS. 1A, 1B, 1C, and 1D can be represented by [S] as follows:

$$[S] = \begin{bmatrix} 0 & e^{j(-\phi-\phi_1)} \\ e^{j(\phi-\phi_1)} & 0 \end{bmatrix}$$

where: j is the square root of −1. The −ϕ in the term on the top right corner and +ϕ in the term on the bottom left corner show that the phase is non-reciprocal.

FIGS. 2A, 2B, 2C, and 2D show an example of how non-reciprocal amplitude (an isolator) can be implemented in some embodiments.

Figure 2A:
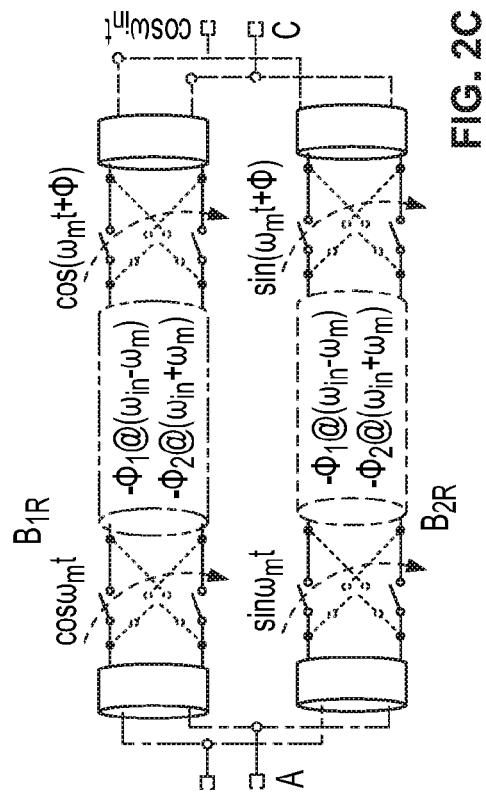
FIGS. 2A, 2B, 2C, and 2D are example illustrations of how non-reciprocal amplitude (an isolator) can be implemented in some embodiments.
Figure 2B:
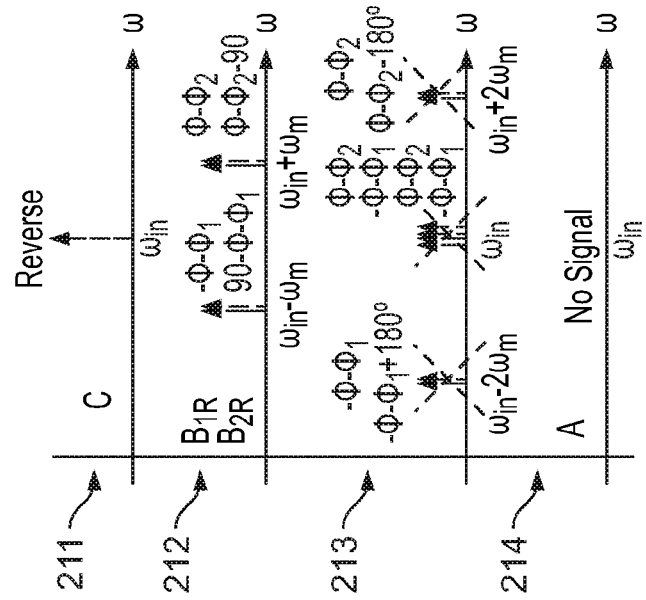

Turning to FIG. 2A, it can be seen that a signal $\cos(\omega_{in}t)$ can be injected at nodes A. This is represented in graph 201 of FIG. 2B. As shown in FIG. 2A, the switch groups can then be switched by the following signals: $\cos(\omega_m t)$; $\cos(\omega_m t+\Phi)$; $\sin(\omega_m t)$; and $\sin(\omega_m t+\Phi)$, where $\Phi$ is 45°. $\Phi_1$ and $\Phi_2$ shown in FIGS. 2A and 2B relate to $\Phi$ according to the following equation: $2\Phi=90°=\Phi_1-\Phi_2$ (or equivalently, $4*T_d*\omega_m/\pi=1$ where $T_d$ is the delay of the transmission lines). As a result of the switching at the switch groups closest to nodes A, the input signal is commutated and two mixing products appear after the commutation on each transmission line at $\omega_{in}-\omega_m$ and $\omega_{in}+\omega_m$. These signals then flow through the top and bottom transmission lines (which provide $-\Phi_1$ and $-\Phi_2$ phase shifts at $\omega_{in}-\omega_m$ and $\omega_{in}+\omega_m$, respectively). The mixing tones flowing through the top transmission line appear at node $B_{1F}$ with total phase shifts of $-\Phi_1$ and $-\Phi_2$ at $\omega_{in}-\omega_m$ and $\omega_{in}+\omega_m$, respectively. The mixing tones flowing through the bottom line appear at node $B_{2F}$ with total phase shifts of $-\Phi_1+90°$ and $-\Phi_2-90°$) at $\omega_{in}-\omega_m$ and $\omega_{in}+\omega_m$, respectively. This is shown in graph 202 of FIG. 2B. The phase shifted signals are then commutated again at $\omega_m$, by the switch groups closest to nodes C, but with a phase shift of $\Phi$. For each of the four signals in graph 202, two mixing products appear after the commutation at nodes C (for a total of eight signals). As shown in graph 203 of FIG. 2B, the mixing products appear at $\omega_{in}-2\omega_m$, $\omega_{in}$, and $\omega_{in}+2\omega_m$ with phase shifts as shown in the following table:

| Row | Signal in Graph 202 | Mixing Product | Resulting Frequency | Resulting Phase Shift |
|---|---|---|---|---|
| 1 | $\omega_{in} - \omega_m$, $-\Phi_1$ | 1 | $\omega_{in} - 2\omega_m$ | $-\Phi - \Phi_1$ |
| 2 | $\omega_{in} - \omega_m$, $-\Phi_1$ | 2 | $\omega_{in}$ | $\Phi - \Phi_1 = 45° - \Phi_1$ |
| 3 | $\omega_{in} + \omega_m$, $-\Phi_2$ | 1 | $\omega_{in}$ | $-\Phi - \Phi_2 = \Phi - \Phi_1 = 45° - \Phi_1$ |
| 4 | $\omega_{in} + \omega_m$, $-\Phi_2$ | 2 | $\omega_{in} + 2\omega_m$ | $\Phi - \Phi_2$ |
| 5 | $\omega_{in} - \omega_m$, $-\Phi_1 + 90°$ | 1 | $\omega_{in} - 2\omega_m$ | $-\Phi - \Phi_1 - 180°$ |
| 6 | $\omega_{in} - \omega_m$, $-\Phi_1 + 90°$ | 2 | $\omega_{in}$ | $\Phi - \Phi_1 = 45° - \Phi_1$ |
| 7 | $\omega_{in} + \omega_m$, $-\Phi_2 - 90°$ | 1 | $\omega_{in}$ | $-\Phi - \Phi_2 = \Phi - \Phi_1 = 45° - \Phi_1$ |
| 8 | $\omega_{in} + \omega_m$, $-\Phi_2 - 90°$ | 2 | $\omega_{in} + 2\omega_m$ | $\Phi - \Phi_2 - 180°$ |

As can be seen, the signals at $\omega_{in}-2\omega_m$ and $\omega_{in}+2\omega_m$ (in rows 1 and 5 and rows 4 and 8, respectively) are 180° out of phase and thus cancel out. Also, the signals at $\omega_{in}$ (in rows 2, 3, 6, and 7) all have the same phase, and thus add up into a single signal with a phase shift of $\Phi-\Phi_1$, or $45°-\Phi_1$. This is shown in graph 204 of FIG. 2B.

Figure 2C:
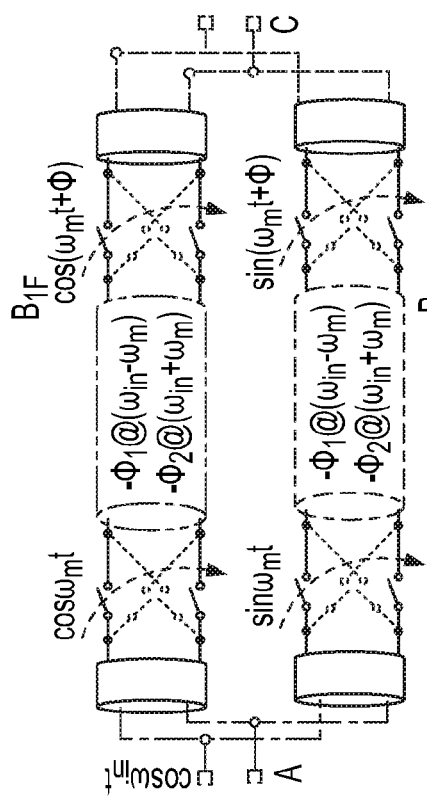

Turning to FIG. 2C, it can be seen that a signal $\cos(\omega_{in}t)$ can be injected at nodes C. This is represented in graph 211 of FIG. 2D. As shown in FIG. 2C, the switch groups can then be switched by the following signals: $\cos(\omega_m t)$; $\cos(\omega_m t+\Phi)$; $\sin(\omega_m t)$; and $\sin(\omega_m t+\Phi)$, where $\Phi$ is 45°. $\Phi_1$ and $\Phi_2$ shown in FIGS. 2C and 2D relate to $\Phi$ according to the following equation: $2\Phi=90°=\Phi_1-\Phi_2$ (or equivalently, $4*T_d*\omega_m/\pi=1$ where Td is the delay of the transmission lines). As a result of the switching at the switch groups closest to nodes C, the input signal is commutated and two mixing products appear after the commutation on each transmission line at $\omega_{in}-\omega_m$ (with phase shifts of $-\Phi$) and $\Phi_{in}+\omega_m$ (with phase shifts of $\Phi$). These signals then flow through the top and bottom transmission lines (which provides $-\Phi_1$ and $-\Phi_2$ phase shifts at $\omega_{in}-\omega_m$ and $\omega_{in}+\omega_m$, respectively). The mixing tones flowing through the top transmission line appear at node B1R with total phase shifts of $-\Phi-\Phi_1$ and $\Phi-\Phi_2$ at $\omega_{in}-\omega_m$ and $\omega_{in}+\omega_m$, respectively. The mixing tones flowing through the bottom line appear at node B2R with total phase shifts of $90°-\Phi-\Phi_1$ and $-90°+\Phi-\Phi_2$ at $\omega_{in}-\omega_m$ and $\omega_{in}+\omega_m$, respectively. This is shown in graph 212 of FIG. 2D. The phase shifted signals are then commutated again at $\omega_m$, by the switch groups closest to nodes A. For each of the four signals in graph 212, two mixing products appear after the commutation at nodes A (for a total of eight signals). As shown in graph 213 of FIG. 2D, the mixing products appear at $\omega_{in}-2\omega_m$, $\omega_{in}$, and $\omega_{in}+2\omega_m$ with phase shifts as shown in the following table:

| Row | Signal in Graph 212 | Mixing Product | Resulting Frequency | Resulting Phase Shift |
|---|---|---|---|---|
| 1 | $\omega_{in} - \omega_m$, $-\Phi - \Phi_1$ | 1 | $\omega_{in} - 2\omega_m$ | $-\Phi - \Phi_1$ |
| 2 | $\omega_{in} - \omega_m$, $-\Phi - \Phi_1$ | 2 | $\omega_{in}$ | $-\Phi - \Phi_1$ |
| 3 | $\omega_{in} + \omega_m$, $\Phi - \Phi_2$ | 1 | $\omega_{in}$ | $\Phi - \Phi_2 = -\Phi - \Phi_1$ |
| 4 | $\omega_{in} + \omega_m$, $\Phi - \Phi_2$ | 2 | $\omega_{in} + 2\omega_m$ | $\Phi - \Phi_2$ |
| 5 | $\omega_{in} - \omega_m$, $90° - \Phi - \Phi_1$ | 1 | $\omega_{in} - 2\omega_m$ | $-\Phi - \Phi_1 - 180°$ |
| 6 | $\omega_{in} - \omega_m$, $90° - \Phi - \Phi_1$ | 2 | $\omega_{in}$ | $-\Phi - \Phi_1$ |
| 7 | $\omega_{in} + \omega_m$, $\Phi - \Phi_2 - 90°$ | 1 | $\omega_{in}$ | $\Phi - \Phi_2 = -\Phi - \Phi_1$ |
| 8 | $\omega_{in} + \omega_m$, $\Phi - \Phi_2 - 90°$ | 2 | $\omega_{in} + 2\omega_m$ | $\Phi - \Phi_2 - 180°$ |

As can be seen, the signals at $\omega_{in}-2\omega_m$, $\omega_{in}$, and $\omega_{in}+2\omega_m$ (in rows 1 and 5, rows 2, 3, 6, and 7, and rows 4 and 8, respectively) are 180° out of phase and thus cancel out. This is shown in graph 214 of FIG. 2D.

Figure 2D:
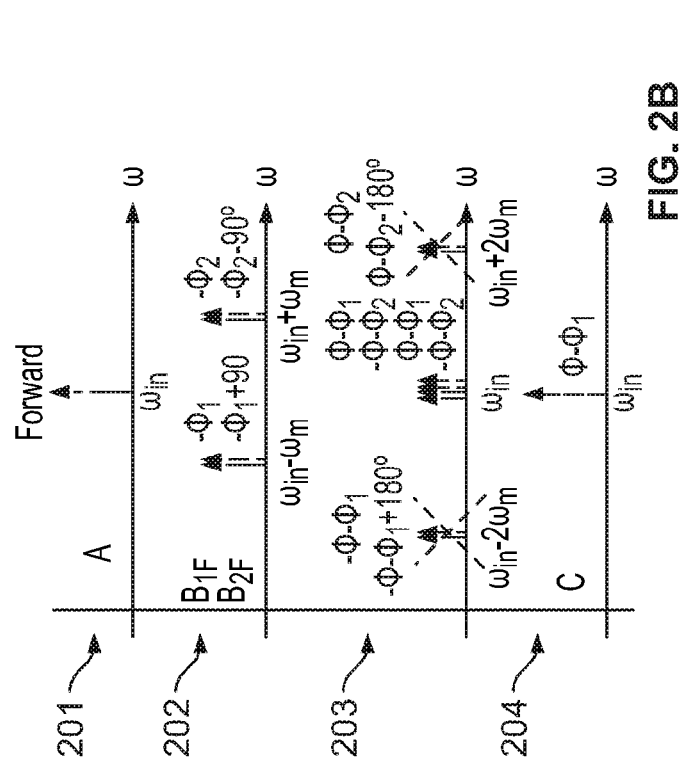

As can be seen in FIGS. 2C and 2D, the signal at $\omega_{in}$ can only pass in the forward direction while it is completely attenuated in the reverse direction, showing amplitude non-reciprocity.

FIGS. 2A, 2B, 2C, and 2D describe an isolator configuration, where signals can travel in one direction but not the reverse direction. An isolator is like one arm of a circulator. It is useful because it can be placed between a power amplifier and its antenna, and it will protect the power amplifier from back reflections at the antenna.

Another use of the structures of FIGS. 1A, 1B, 2A, and 2B is a 2D lattice of such structures which can have a programmable signal propagation based on the phase shifts of the different switches.

In FIGS. 1A, 1B, 2A, and 2B, mixing products at $\omega_{in}-\omega_m$ and $\omega_{in}+\omega_m$ have been shown for simplicity, but, in reality, square-wave commutation can produce mixing products at offsets equal to all odd multiples of $\omega_m$.

Figure 3:
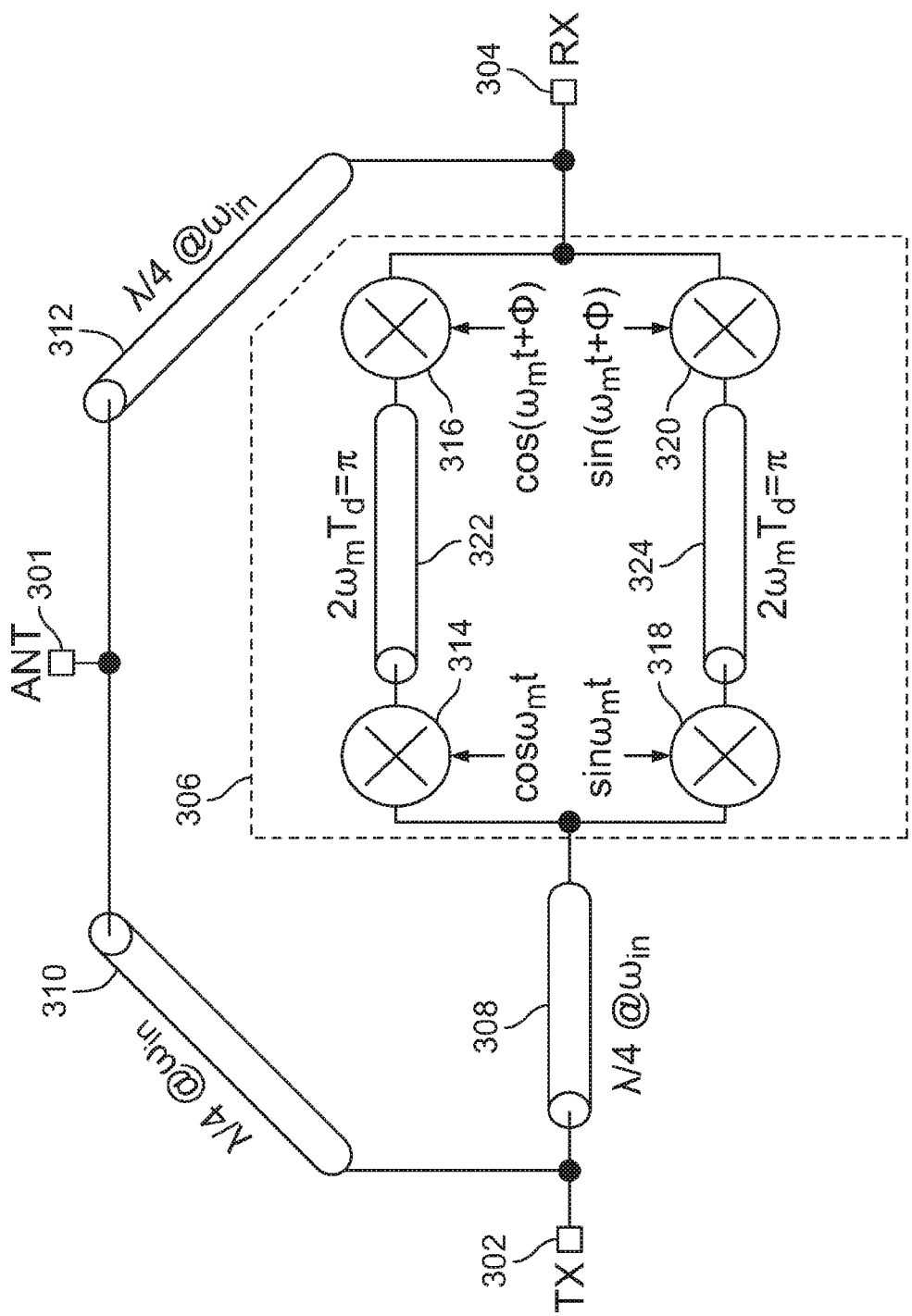
FIG. 3 is an example of a circulator architecture in accordance with some embodiments.

Turning to FIG. 3, an example 300 of a circulator architecture in accordance with some embodiments is shown. As illustrated, circulator 300 includes an antenna port 301, a transmitter port 302, a receiver port 304, a non-reciprocal phase component 306, and transmission lines 308, 310, and 312. Within non-reciprocal phase component 306, there are passive mixers 314, 316, 318, and 320, and transmission lines 322 and 324.

As shown in FIG. 3, values of signals and components in non-reciprocal phase component 306 may depend on an input frequency ($\omega_{in}$) and a modulation frequency ($\omega_m$). $\omega_{in}$ represents the frequency of operation of the circulator. $\omega_m$ represents the frequency at which the mixers are modulated. Any suitable frequencies can be used for $\omega_{in}$ and $\omega_m$, in some embodiments. For example, in some embodiments, RF/millimeter-wave/Terahertz frequencies can be used. In some embodiments, $\omega_{in}$ and $\omega_m$ may be required to be sized relative to each other. For example, in some embodiments, the mixing signals at $\omega_{in}+\omega_m$ and $\omega_{in}-\omega_m$ should be 180° out of phase or equivalently the following equation may be required to be met: $2\omega_m T_d = 180°$, where $T_d$ is the group delay. More particularly, for example, in some embodiments, $\omega_{in}$ can be 28 GHz and $\omega_m$ can be 9.33 GHz.

Each of the transmission lines in FIG. 3 is illustrated as having a "length" that is based on a given frequency. For example, transmission lines 308, 310, and 312 are illustrated as having a length equal to $\lambda/4$, where $\lambda$ is the wavelength for a frequency of $\omega_{in}$. As another example, transmission lines 322 and 324 are illustrated as providing 180° phase difference between the signals at $\omega_{in}+\omega_m$ and $\omega_{in}-\omega_m$ or equivalently a group delay of $T_d = \frac{1}{4}(\omega_m/2\pi)$.

Transmission lines 308, 310, 312, 322, and 324 can be implemented in any suitable manner. For example, in some embodiments, one or more of the transmission lines can be implemented as C-L-C pi-type lumped sections. In some other embodiments, they may be implemented as truly distributed transmission lines.

The passive mixers can be driven by signals as shown in FIG. 3, in some embodiments. For example, in some embodiments, mixer 314 can be driven by a signal $\cos(\omega_m t)$, mixer 316 can be driven by a signal $\cos(\omega_m t+\Phi)$, mixer 318 can be driven by a signal $\sin(\omega_m t)$, and mixer 320 can be driven by a signal $\sin(\omega_m t+\Phi)$, where $\Phi$ is 90° for $T_d = \frac{1}{4}(\omega_m/2\pi)$.

In some embodiments, mixers 314, 316, 318, and 320 shown in FIG. 3 can be implemented with switch groups 414, 416, 418, and 420, respectively, as illustrated in FIG. 4A. As shown in FIG. 4B, the switch groups in FIG. 4A can each include four switches 402, 404, 406, and 408, in some embodiments.

The switches in the switch groups can be implemented in any suitable manner. For example, in some embodiments, the switches can be implemented using NMOS transistors, PMOS transistors, both NMOS and PMOS transistors, or any other suitable transistor or any other switch technology.

Switch groups 414, 416, 418, and 420 can be controlled by local oscillator signals LO1, LO2, LO1Q, and LO2Q, respectively, as shown in FIG. 4A, in some embodiments. A timing diagram showing an example of these signals with respect to each other is shown in FIG. 4C. In this diagram, $f_{LO}$ is equal to $\omega_m/2\pi$. When a local oscillator (e.g., LO1, LO2, LO1Q, or LO2Q) is HIGH, switches 402 and 408 in the corresponding switch group are CLOSED and switches 404 and 406 in the corresponding switch group are OPEN. When a local oscillator (e.g., LO1, LO2, LO1Q, or LO2Q) is LOW, switches 404 and 406 in the corresponding switch group are OPEN and switches 404 and 406 in the corresponding switch group are CLOSED.

Figure 5:
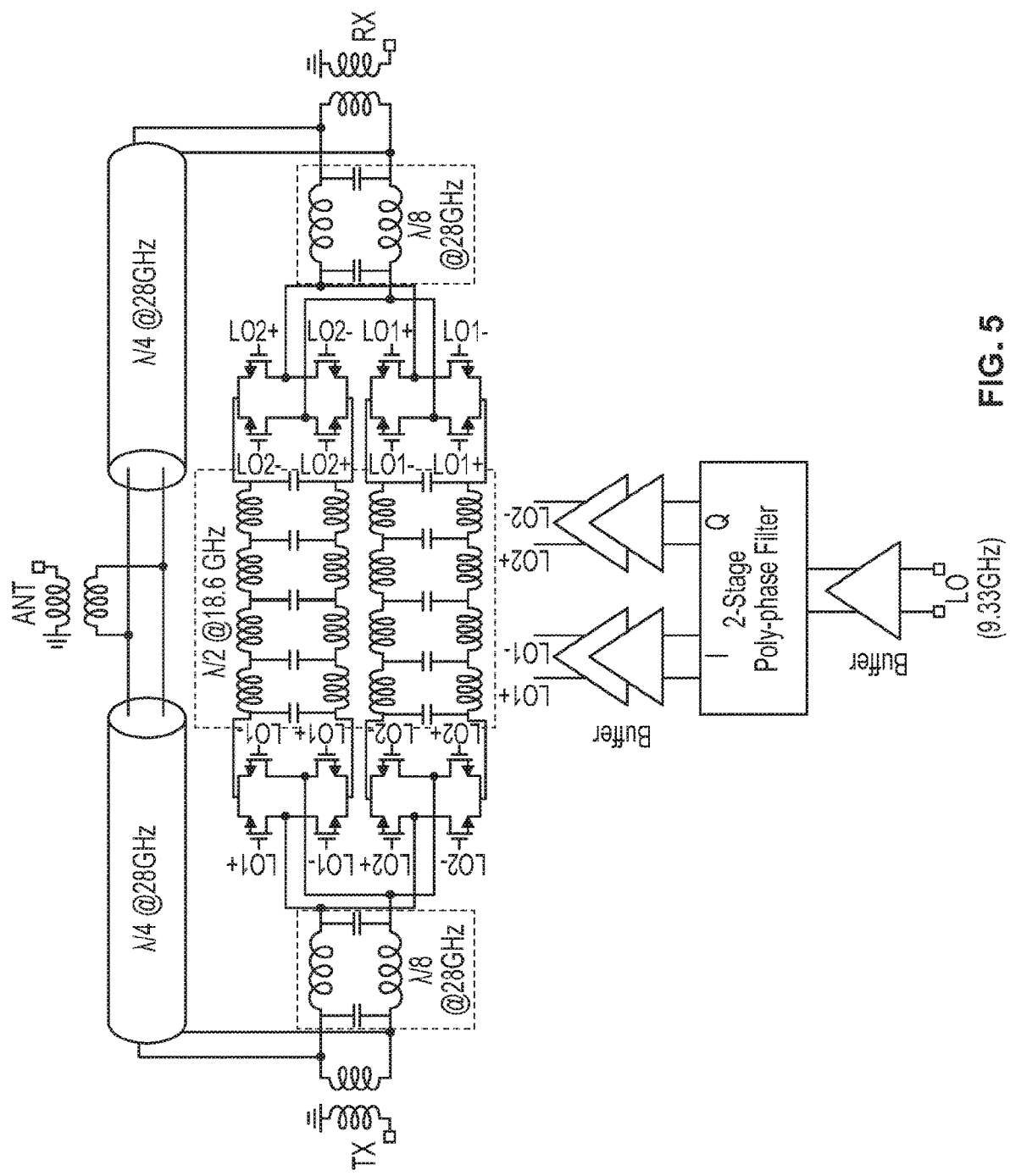
FIG. 5 is an example of a schematic of a circulator in accordance with some embodiments.

Turning to FIG. 5, an example of a schematic of a circulator that can be implemented in accordance with some embodiments is shown. This circulator is generally in the same architecture as shown in FIG. 3, except that transmission line 308 is split in half and part is placed adjacent to the receiver nodes.

The differential nature of the circulator can reduce the LO feedthrough and improve power handling. The fully-balanced I/Q quads can be designed using 2×16 μm/40 nm floating-body transistors. The placement of the gyrator in a symmetric fashion between the TX and RX ports can be used to enable switch parasitics to be absorbed into the lumped capacitance of the $\lambda/8$ sections on either side. Artificial (quasi-distributed) transmission lines with inductor Q of 20 can be used in the gyrator, using four stages of lumped $\pi$-type C-L-C sections with a Bragg frequency of 83.9 GHz. The $\lambda/4$ transmission lines between the TX and ANT and ANT and RX ports can be implemented using differential conductor-backed coplanar waveguides. As shown, baluns can be included at the TX, ANT and RX ports to enable single-ended measurements, and separate test structures can be included to de-embed the response of the baluns.

Figure 6:
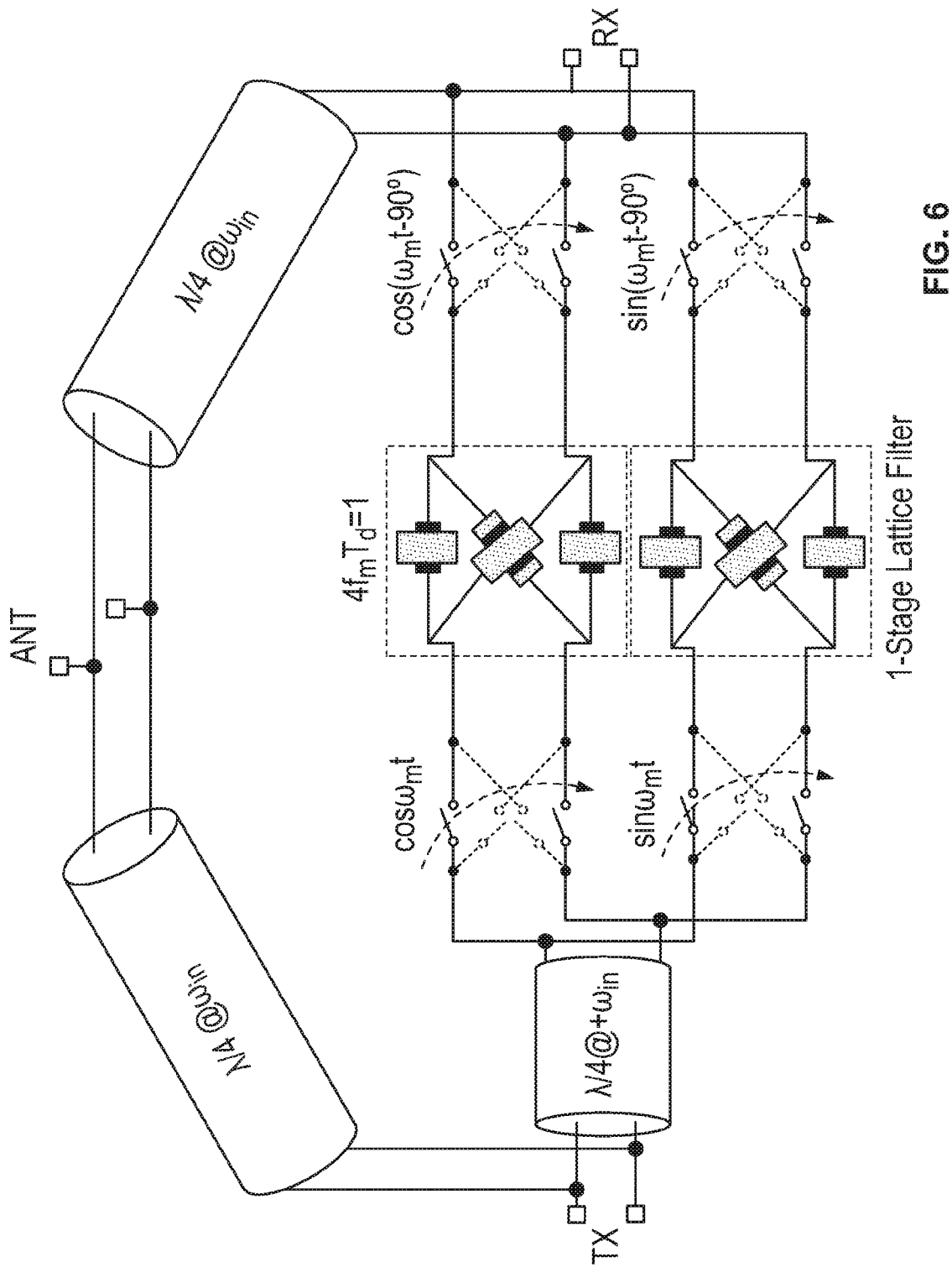
FIG. 6 is an example of a schematic of a circulator including a 1-stage lattice filter in accordance with some embodiments.

Turning to FIG. 6, an example of the architecture of FIG. 3 using 1-stage lattice filters instead of transmission lines 322 and 324 (FIG. 3) is shown. Any suitable filters can be used. For example, in some embodiments, film bulk acoustic resonator (FBAR) filters, surface acoustic wave (SAW) filters, bulk acoustic wave (BAW) filters, and/or any other suitable filters can be used. By implementing large delays using SAW or BAW filters, the clock frequency can be even further reduced. This can be exploited to design even-higher-linearity circulators through the use of high-voltage technologies and high-linearity switch design techniques.

The circuits described herein can be implemented in any suitable technology in some embodiments. For example, in some embodiments, these circuits can be implemented in any semiconductor technology such as silicon, Gallium Nitride (GaN), Indium phosphide (InP), Gallium arsenide (GaAs), etc. More particularly, for example, in some embodiments, the circuits can be implemented in IBM 45 nm SOI CMOS process.

In FIG. 1, the phase shift provided by the non-reciprocal phase component, $\Phi-\Phi_1$, can be tuned by changing the clock phase, Φ. The frequency at which TX-to-RX isolation is achieved depends on Φ–Φ$_1$, so by tuning Φ, the isolation frequency can be tuned.

Figure 7:
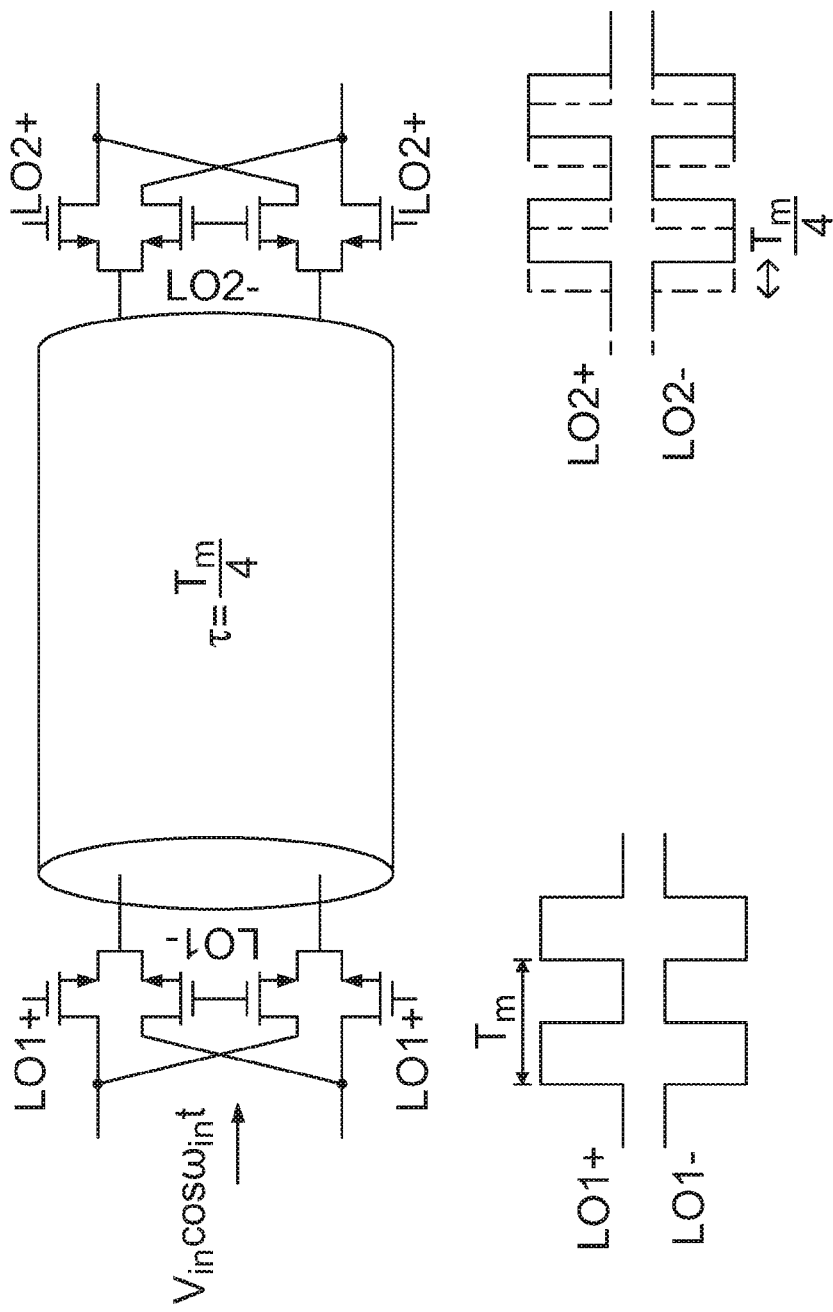
FIG. 7 is an example of schematic of a non-reciprocal circuit element in accordance with some embodiments.

Turning to FIG. 7, another example of some embodiments is shown. As illustrated, a spatio-temporal conductivity modulation concept in accordance with some embodiments can include two sets of switches implemented in a fully-balanced fashion on either end of a differential transmission line delay. The switches can be modulated between short and open circuit states through periodic square pulses with a 50% duty cycle. As shown, the transmission line provides a delay equal to one quarter of the modulation period ($T_m/4$), and the modulation of the right switches is delayed with respect to those on the left by the same amount ($T_m/4$). Adding this delay between the two sets of switches allows incident signals from different directions to follow different paths, breaking reciprocity.

FIGS. 8A, 8B, and 8C depict an example of signal propagation in the forward direction (from left, or port 1, to right, or port 2) in accordance with some embodiments. As shown in FIG. 8A, during the first half-period of the modulation clock, when LO1+ is high, the incident signal goes into the transmission line, gets delayed by the transmission line delay of $T_m/4$, and reaches to the second set of switches. At this instant, LO2+ is high, so that the signal directly passes to the output. A similar explanation holds also for the second half-period of the modulation clock (shown in FIG. 8B): the signal goes into the transmission line with a sign flip, gets delayed by $T_m/4$, and the sign flip is recovered by the second set of switches. In other words, signals traveling in the forward direction experience no polarity inversion in the first half cycle, and two polarity inversions negate each other occur in the second half cycle. Thus, effectively, in the forward direction, signals pass through the structure without any loss and experience a delay of one quarter of the modulation period. This can be described by the time domain equation:

$$v_2^-(t) = v_1^+\left(t - \frac{T_m}{4}\right)$$

where $v_1^+$ and $v_2^-$ are the incident and transmitted signals at ports 1 and 2, respectively.

Alternatively, this structure can be modeled by multiplication, delay and multiplication as depicted in FIG. 8C. Here, the fully-balanced switching operation is modeled as multiplication by a 50% duty cycle clock, m(t), flipping between +1 and −1. Thus, the output signal can be written as:

$$v_2^-(t) = v_1^+\left(t - \frac{T_m}{4}\right)m\left(t - \frac{T_m}{4}\right)m\left(t - \frac{T_m}{4}\right) = v_1^+\left(t - \frac{T_m}{4}\right) \quad (1)$$

which takes advantage of the fact that $$m\left(t - \frac{T_m}{4}\right)m\left(t - \frac{T_m}{4}\right) = +1$$

for a binary (−1, +1) signal.

The signal propagation in the backward direction (from right to left) is shown in FIGS. 9A, 9B, and 9C. As shown in FIG. 9A, during the first half-period of the modulation clock, when LO2+ is high, the signal goes into the transmission line and gets delayed by $T_m/4$, and the second set of switches flips the signal sign. Similarly, during the second half-period of the modulation clock (LO2− is high), the signal goes into the transmission line with a sign flip, gets delayed by $T_m/4$ and reaches the output as LO1+ is high. In brief, signals traveling from right to left experience a transmission line delay of $T_m/4$ and a polarity inversion in both half cycles. This can be described by:

$$v_1^-(t) = -v_2^+\left(t - \frac{T_m}{4}\right)$$

where $v_2^+$ and $v_1^-$ are the incident and transmitted signals at ports 1 and 2, respectively.

An analysis based on the signal flow diagram in FIG. 9C gives $$v_1^-(t) = v_2^+\left(t - \frac{T_m}{4}\right)m\left(t - \frac{T_m}{2}\right)m(t) = -v_2^+\left(t - \frac{T_m}{4}\right) \quad (2)$$

which takes advantage of m(t−$T_m$/2)m(t)=−1 for a binary (−1, +1) 50% duty-cycle signal.

From (1) and (2), the resultant S-parameters can be written as $$S_{21}(\omega_{in}) = e^{-j\frac{\pi}{2}\left(\frac{\omega_{in}}{\omega_m}\right)} \quad (3)$$

$$S_{12}(\omega_{in}) = -e^{-j\frac{\pi}{2}\left(\frac{\omega_{in}}{\omega_m}\right)} \quad (4)$$

where $\omega_{in}$ and $\omega_m$ are the signal and modulation frequencies, respectively. It should be noted $S_{11}=S_{22}=0$ since there is a pair of switches which connects the transmission line to the input and output at any instant in both half cycles. As can be seen from (3) and (4), this generalized spatio-temporal conductivity modulation technique is ideally lossless and breaks phase reciprocity over a theoretically infinite bandwidth. More importantly, it operates as an ideal passive lossless gyrator—a basic non-reciprocal component that provides a non-reciprocal phase difference of π and can be used as a building block to construct arbitrarily complex non-reciprocal networks—over theoretically infinite bandwidth. In practice, the insertion loss would be limited by ohmic losses in the switches and transmission line, and bandwidth by dispersion effects in the transmission line, particularly if it is implemented in a quasi-distributed fashion to absorb the capacitive parasitics of the switches.

Figure 10:
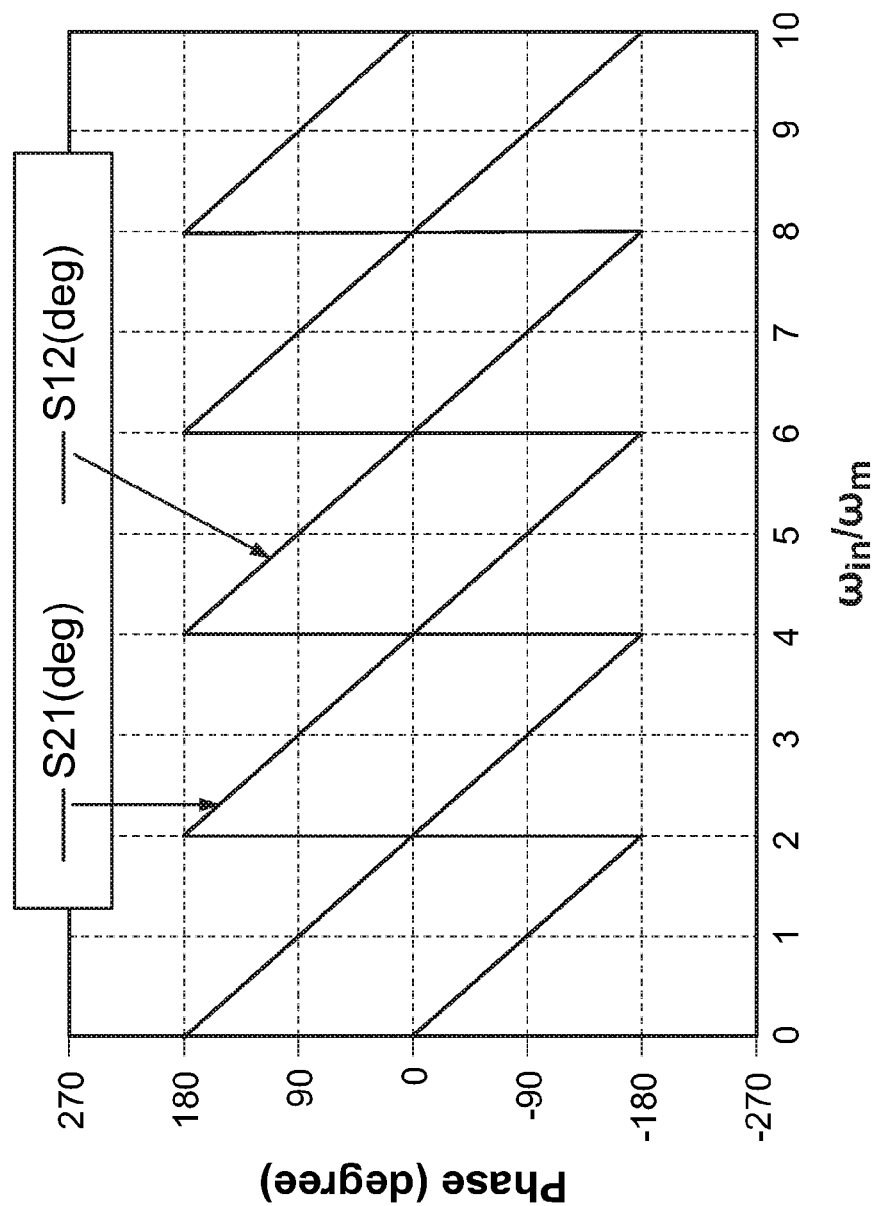
FIG. 10 is an example illustration of forward and reverse insertion phases across frequency normalized to a modulation clock frequency in accordance with some embodiments.

FIG. 10 shows an example of an illustration of forward and reverse insertion phases (∠S21 and ∠S12, respectively) across frequency normalized to the modulation clock frequency. As can be seen, the spatio-temporal conductivity modulation provides a phase shift of +/−90 degrees at the odd multiples of the modulation frequency, namely $\omega_{in}=$ (2n−1)$\omega_m$, where n is a positive integer. Using higher odd multiples reduces the clock frequency, which eases clock generation and distribution, at the expense of a longer transmission line which introduces more loss and larger form factor. In some embodiments, an operating to modulation frequency ratio of 3($\omega_m=\omega_{in}$/3=8.33 GHz) can be used to optimize this trade-off.

Figure 11:
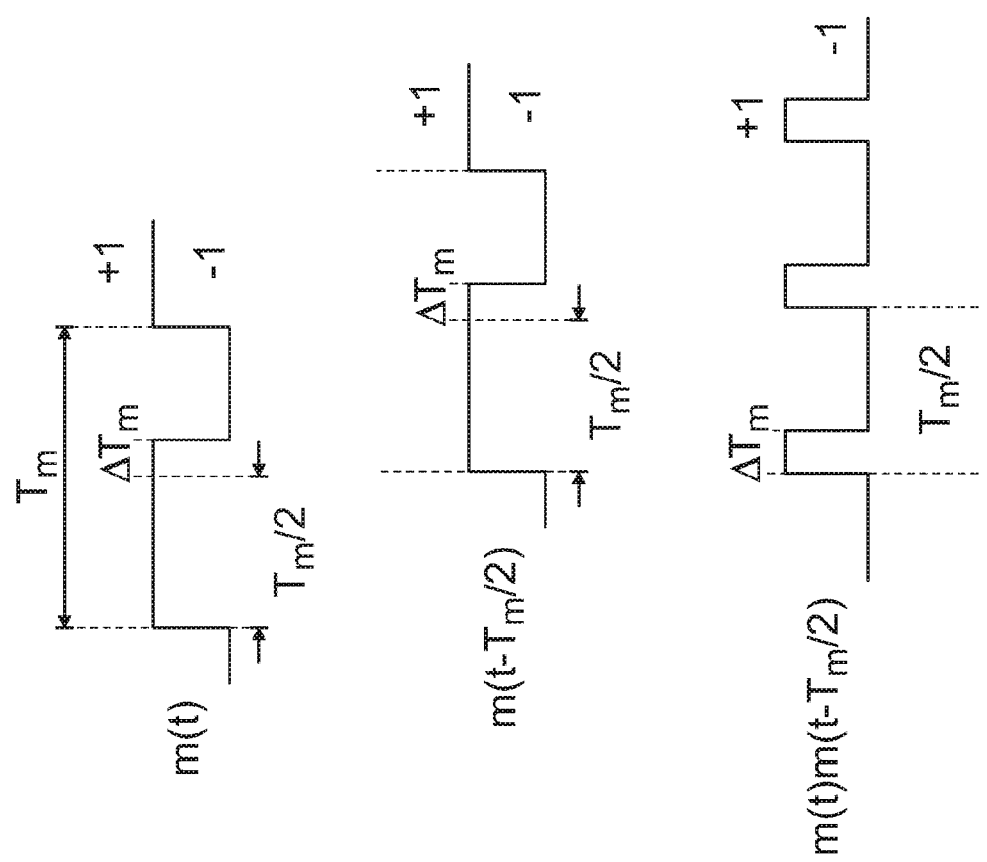
FIG. 11 is an example illustration of adverse effects on the operation of a non-reciprocal circuit element when operating with a non-50% duty cycle local oscillator in accordance with some embodiments.

In some embodiments, duty cycle impairment in the modulation clock can have an adverse effect on operation in the reverse direction. For example, let us assume a deviation from ideal 50% duty cycle by $\Delta T_m$. The forward direction remains unaffected, since $m(t-T_m/4)m(t-T_m/4)$ continues to be +1, but in the reverse direction, $m(t-T_m/2)m(t)$ will give a pulse train with a pulse width of $\Delta T$ and period of $T_m/2$ as depicted in FIG. 11. Thus, deviation from 50% duty cycle would result in loss in the reverse direction, as some portion of the power would be transferred to mixing frequencies due to the $2\omega_m$ content in $m(t-T_m/2)m(t)$. $S_{12}$ at the operating frequency becomes $$S_{12}(\omega_{in}) = \left(-1 + \frac{4\Delta T_m}{T_m}\right) e^{-j\frac{\pi}{2}\left(\frac{\omega_{in}}{\omega_m}\right)} \quad (5)$$

As shown in FIG. 12A, a non-reciprocal phase shift element (gyrator) can be embedded within a 3λ/4 transmission line ring to realize a non-reciprocal circulator in accordance with some embodiments. In the clockwise direction, the −270 degree phase shift of the transmission line adds to the −90 degree phase shift through the gyrator, enabling wave propagation (−270+−90=−360). In the counter-clockwise direction, the −270 degree phase shift of the transmission line adds to the +90 degree phase shift of the gyrator, suppressing wave propagation (−270++90=−180).

A three-port circulator can be realized in some embodiments by introducing three ports λ/4 apart from each other as shown in FIG. 12B. The gyrator can placed symmetrically between the TX and RX ports in some embodiments. The S-parameters of the circulator at $\omega_{in}=3\omega_m$ can be derived to be:

$$\begin{pmatrix} 0 & 0 & -1 \\ -j & 0 & 0 \\ 0 & -j & 0 \end{pmatrix}$$

where TX is port 1, ANT is port 2, and RX is port 3.

Figure 13:
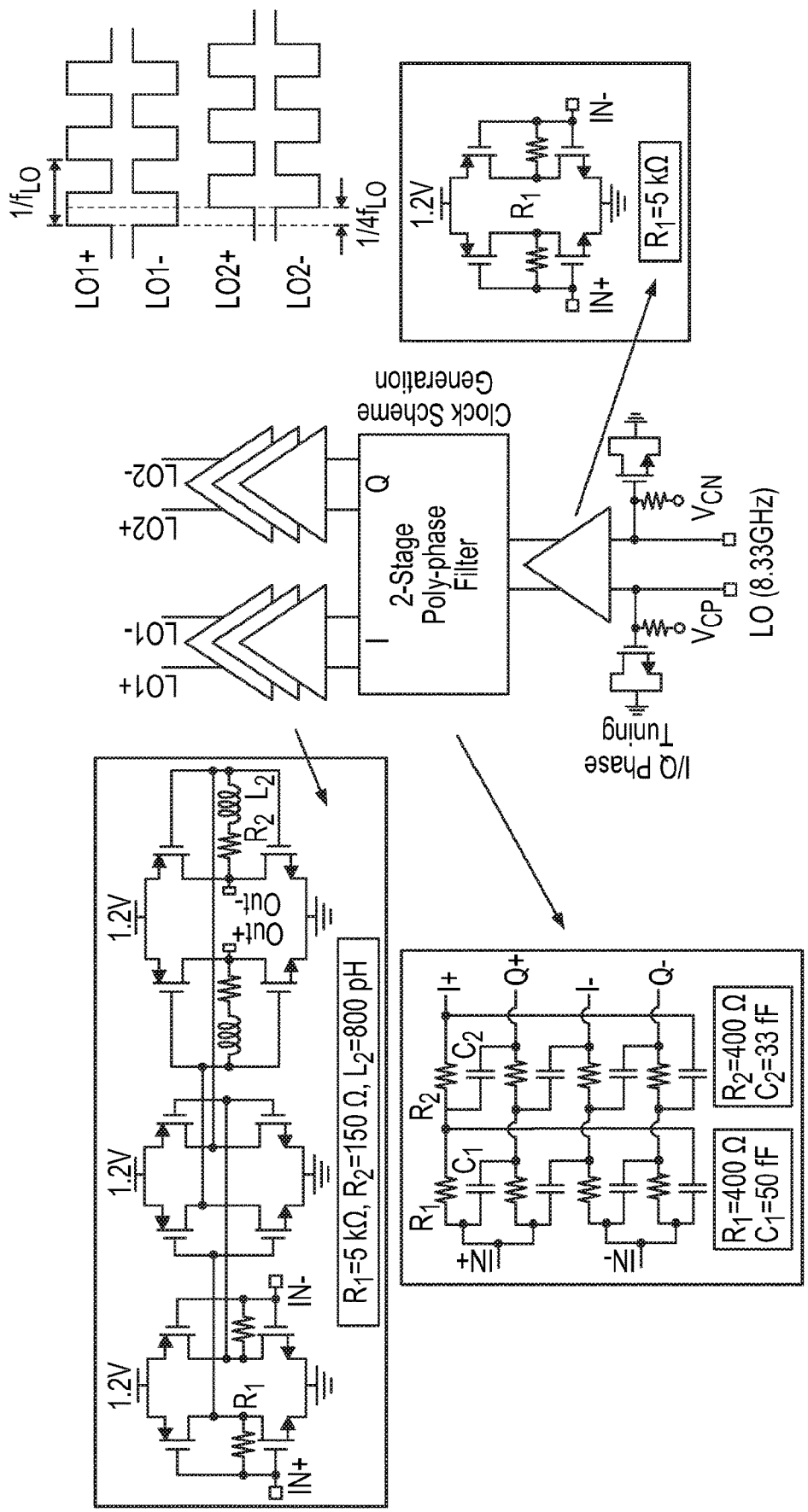
FIG. 13 is an example of a block diagram and circuit diagrams of a local oscillator path in accordance with some embodiments.

FIG. 13 shows an example of a block diagram and circuit diagrams of an 8.33 GHz LO path in accordance with some embodiments. As illustrated, the four quadrature clock signals driving the switches can be generated from two input differential sinusoidal signals at 8.33 GHz. A two-stage poly-phase filter (phase imbalance <2 degrees for up to 15% variation in R and C values) can be used to generate the 8.33 GHz quadrature signals with 0/90/180/270 degree phase relationship. After the poly-phase filter, a three stage self-biased CMOS buffer chain with inductive peaking in the final stage can be used to generate the square wave clock signals for the switches. Independently controlled NMOS varactors (implemented using 4×40 μm/40 nm floating-body devices) can be placed at the differential LO inputs to compensate for I/Q imbalance of the poly-phase filter. This provides an I/Q calibration range of +/−10 degrees that can be used optimize the circulator performance.

Figure 14B:
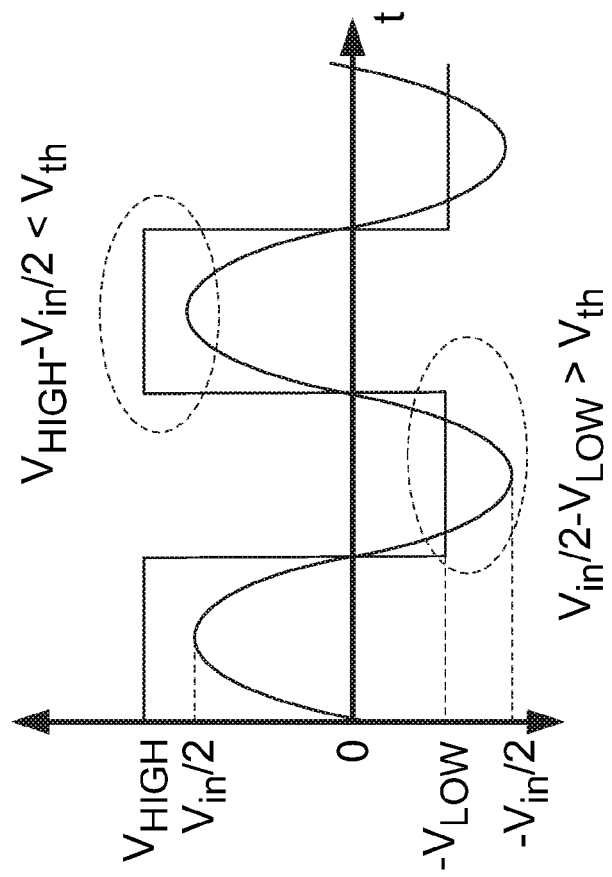
FIGS. 14A and 14B illustrate an example of a problem that can occur when an input signal at a passive mixer approaches the amplitude of a modulator signal in accordance with some embodiments.
Figure 14A:
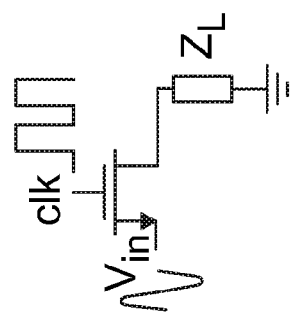

Turning to FIG. 14A, a switch that can be used in the passive mixers described above (e.g., any one or more of switches 402, 404, 406, and 408 of FIG. 4B) is illustrated. As shown, the switch may have a clock (clk) at its gate and an input signal ($V_{in}$) at its source. An impedance $Z_L$ may be present at the switch's drain.

A passive mixer compresses when the RF swing on the source/drain of the transistor becomes comparable to the modulation signal at the gate. For a large enough RF swing, the mixer is modulated by the RF signal rather than the modulation signal resulting in false switching and hence compression.

As shown in FIG. 14B, when $V_{in}$ (represented by the sine wave shown) gets large, for given high and low voltage levels ($V_{HIGH}$ and $V_{LOW}$, respectively) of the clock, the difference between the high voltage level and the input signal divided by two can be less than the threshold voltage of the switch, and the difference between the input signal divided by two and the low voltage level can be greater than the threshold voltage of the switch. This can cause improper behavior of the switch.

In accordance with some embodiments mechanisms for clock boosting are provided that can address this problem. These mechanisms produce a larger modulation signal thereby enabling mixers to handle higher RF power.

Figure 15:
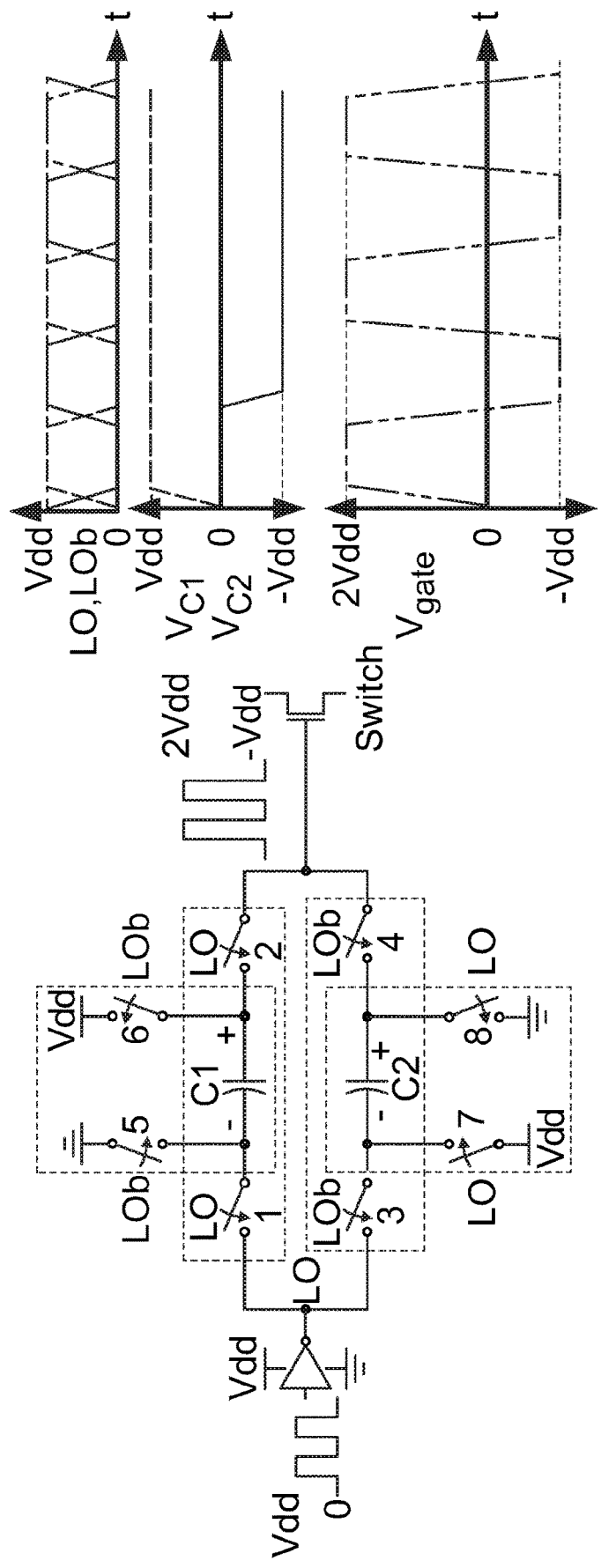
FIG. 15 illustrates an example of a boosting circuit and a timing diagram for same in accordance with some embodiments.

Turning to FIG. 15, an example of a mechanism for clock boosting in accordance with some embodiments is illustrated. As shown, this mechanism includes an inverter at the left, eight switches numbered 1-8, capacitors C1 and C2, and a switch at the right (which is part of a passive mixer). In some embodiments, the inverter need not be added to an existing design and the signal LO provided at the output of the inverter can be provided by any suitable component of a circuit that has been designed to drive a passive mixer's switch.

During operation, when the output (LO) of the driving inverter (the driver) is high ($+V_{DD}$), the output of the driver is level shifted using a pre-charged capacitor (C1, which is charged to $+V_{DD}$) to create a high output level of $+2V_{DD}$ as shown in the timing diagram on the right of FIG. 15. When the output of the driving inverter is low (0 Volts), the output of the driver is level shifted using a pre-charged capacitor (C2, which is charged to $-V_{DD}$) to create a low output level of $-V_{DD}$. Hence, the output swing of the driving inverter is boosted to create a 3× higher modulation swing. That is, as shown in the timing diagram on the right of FIG. 15, the signal driving the gate of the switch transitions between −Vdd and +2Vdd instead of between 0 and Vdd.

The function performed by the circuit of FIG. 15 can be represented by the following equation:

$$V_{gate}(t) = LO(t) + V_{C1}(t) * \left(\frac{LO(t)}{Vdd}\right) + V_{C2}(t) * \left(\frac{LOb(t)}{Vdd}\right)$$

In the timing diagram, the voltages $V_{C1}$ and $V_{C2}$ across capacitors C1 and C2 are shown as being constant even though slight variations in these voltages may occur due to parasitic in the path between the driver and the gate. Although + and − symbols are shown in the figure to provide a reference for voltage measurements, these symbols do not denote that the capacitors are or need to be polarized.

Figure 16:
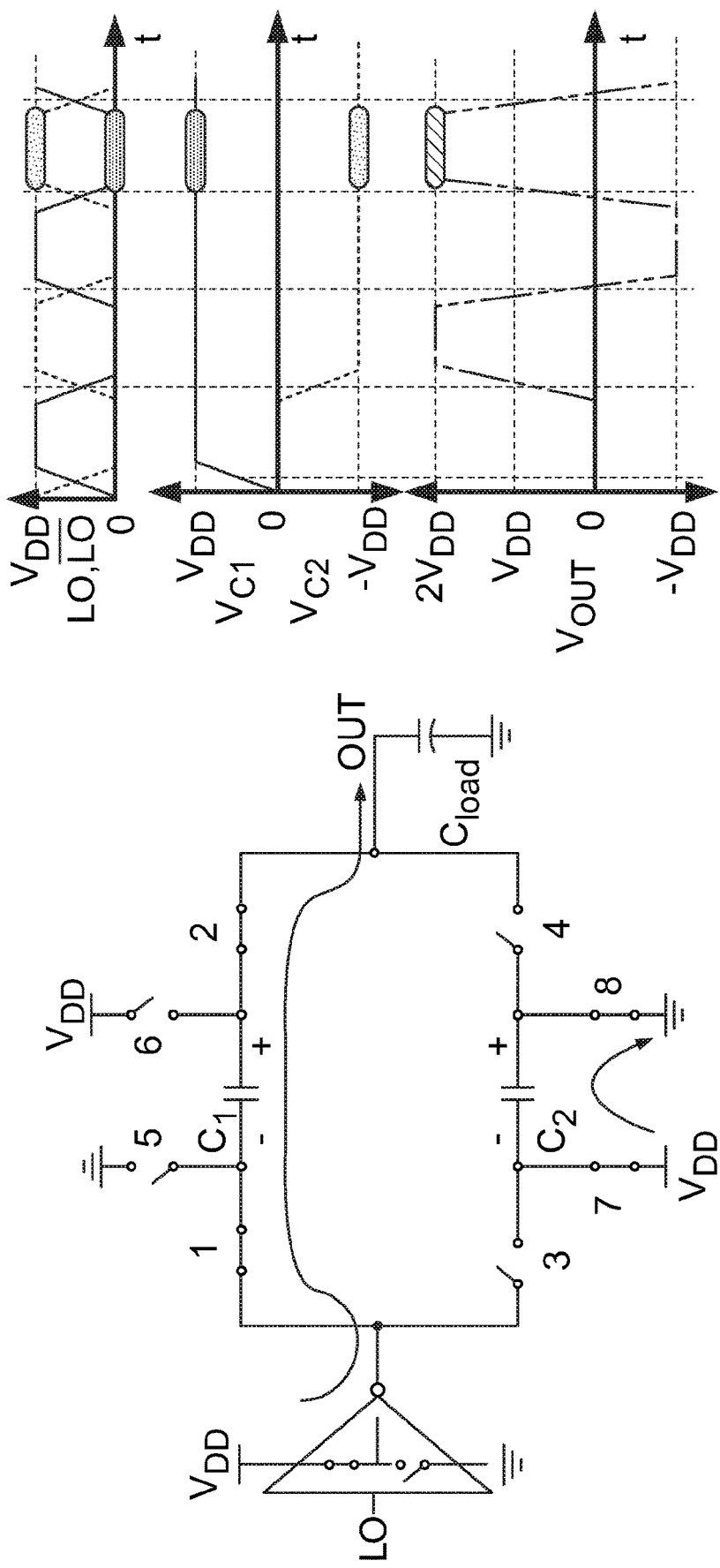
FIG. 16 illustrates an example of the operation of a boosting circuit in accordance with some embodiments.

FIGS. 16 and 17 further illustrate the operation of the circuit shown in FIG. 15 in accordance with some embodiments. As shown in FIG. 16, when the output of the driver is high (e.g., +Vdd), switch 1, 2, 7, and 8 are closed, and switches 3, 4, 5, and 6 are open. This causes the voltage across capacitor C1 (+Vdd) to be added to the signal (+Vdd) at the output of the driver to produce +2Vdd at the gate of the switch (represented in FIG. 16 by $C_{load}$). At the same time, capacitor C2 is charged to −Vdd. As shown in FIG. 17, when the output of the driver is low (e.g., 0V), switch 1, 2, 7, and 8 are open, and switches 3, 4, 5, and 6 are closed. This causes the voltage across capacitor C2 (−Vdd) to be added to the signal (0V) at the output of the driver to produce −Vdd at the gate of the switch (represented in FIG. 17 by $C_{load}$). At the same time, capacitor C1 is charged to +Vdd.

For purposes of illustration, it can be assumed that the switches of FIGS. 15, 16, and 17 are implemented using NMOS transistors, such that when a high signal is applied at the gate of the switch, the switch is closed and such that when a low signal is applied at the gate of the switch, the switch is opened.

Figure 18:
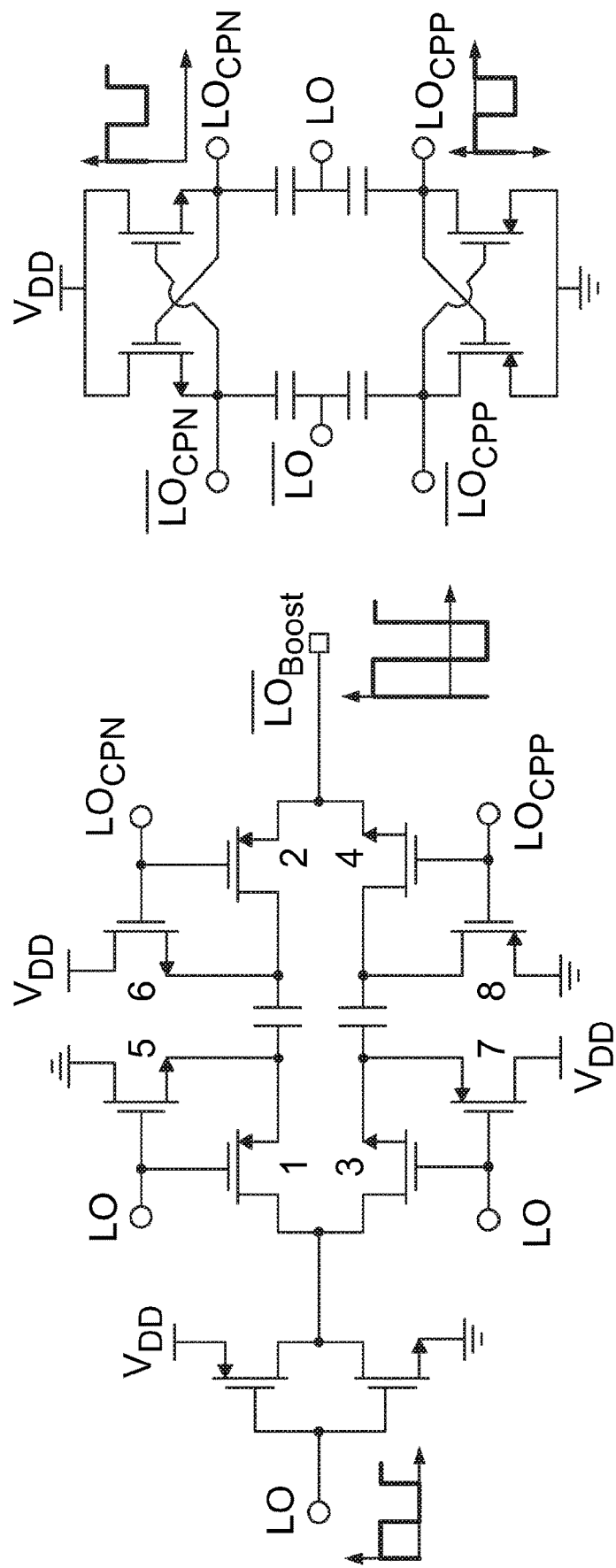
FIG. 18 illustrates an example of an implementation of a boosting circuit in accordance with some embodiments.

Turning to FIG. 18, an example of an implementation of the circuit of FIG. 15 in accordance with some embodiments is shown. As illustrated, switches 1, 2, 7, and 8 can be implemented using PMOS transistors and switches 3, 4, 5, and 6 can be implemented using NMOS transistors. As also illustrated, the gates of transistors 1, 3, 5, and 7 can be driven by signal LO, the gates of transistors 2 and 6 can be driven by signal $LO_{CPN}$, and the gates of transistors 4 and 8 can be driven by signal $LO_{CPP}$. $LO_{CPN}$ and $LO_{CPP}$ (and $\overline{LO}_{CPN}$ and $\overline{LO}_{CPP}$) can be generated by a level shift circuit shown in the right of FIG. 18. Mathematically, $LO_{CPN}$, $LO_{CPP}$, $\overline{LO}_{CPN}$, and $\overline{LO}_{CPP}$ can be represented as:

LO_CPN=−$V_{dd}$+LO $\overline{LO}_{CPN}$=−$V_{dd}$+$\overline{LO}$;

LO_CPP=+$V_{dd}$+LO; and $\overline{LO}_{CPP}$=+$V_{dd}$+$\overline{LO}$

Theoretically, a 3× higher swing can be achieved by increasing the supply voltage and increasing the power consumption by 9×. However, using the technique of clock boosting only the last transistor experiences the higher swing, so the total power consumption will be increased only by a factor of 4-5. In addition, owing to the limit of $2V_{DD}$ for the long-term reliability, supply voltage of a conventional driver cannot be increased to $3V_{DD}$. On the other hand, it is important to notice that despite of achieving a $3\times V_{DD}$ swing, none of the CMOS transistor cross the long-term reliability limit of $2\times V_{DD}$. This clock boosting technique can be used to drive any of the passive mixers described above.

As described above in connection with FIG. 3, the transmission line should be quarter wave at the modulation frequency. Thus, while having a lower modulation frequency implies lower clocking power consumption, a lower modulation frequency means a longer transmission line and the area associated with it. While the electrical length of a lumped LC transmission line can be increased by increasing only the capacitance of the line with negligible increase in the area, doing so also changes the impedance of the transmission line.

When the gyrator is operated in an environment of Zo, it is intuitive to use a transmission line with impedance Zo so that there will be perfect matching. Typically, when we have an interface with Zo on one side and other impedance Zg on another side there will a mismatch.

Figure 19:
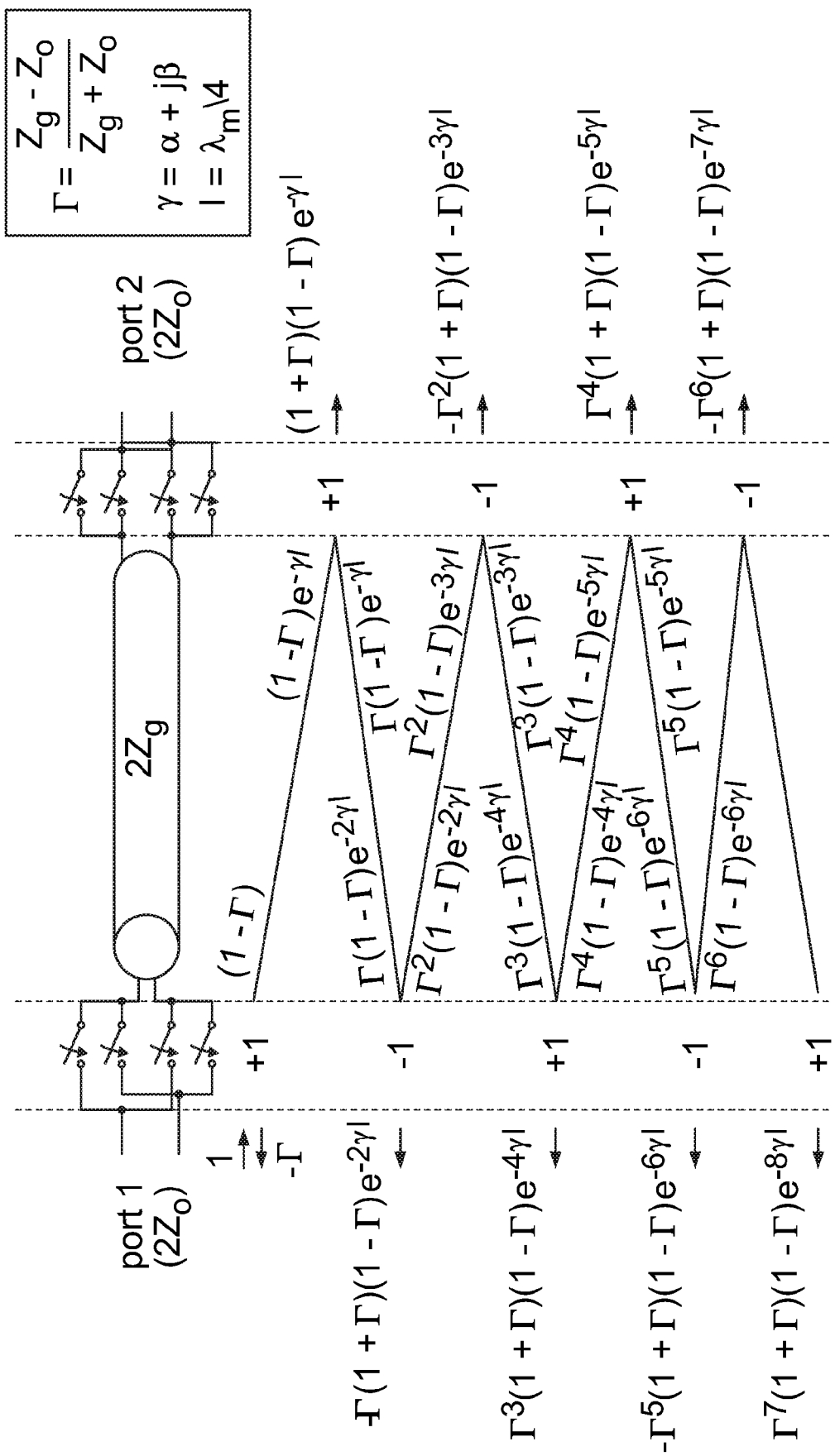
FIG. 19 illustrates an example of the cancellation of reflections in a gyrator with an impedance mismatch in accordance with some embodiments.
Figure 23:
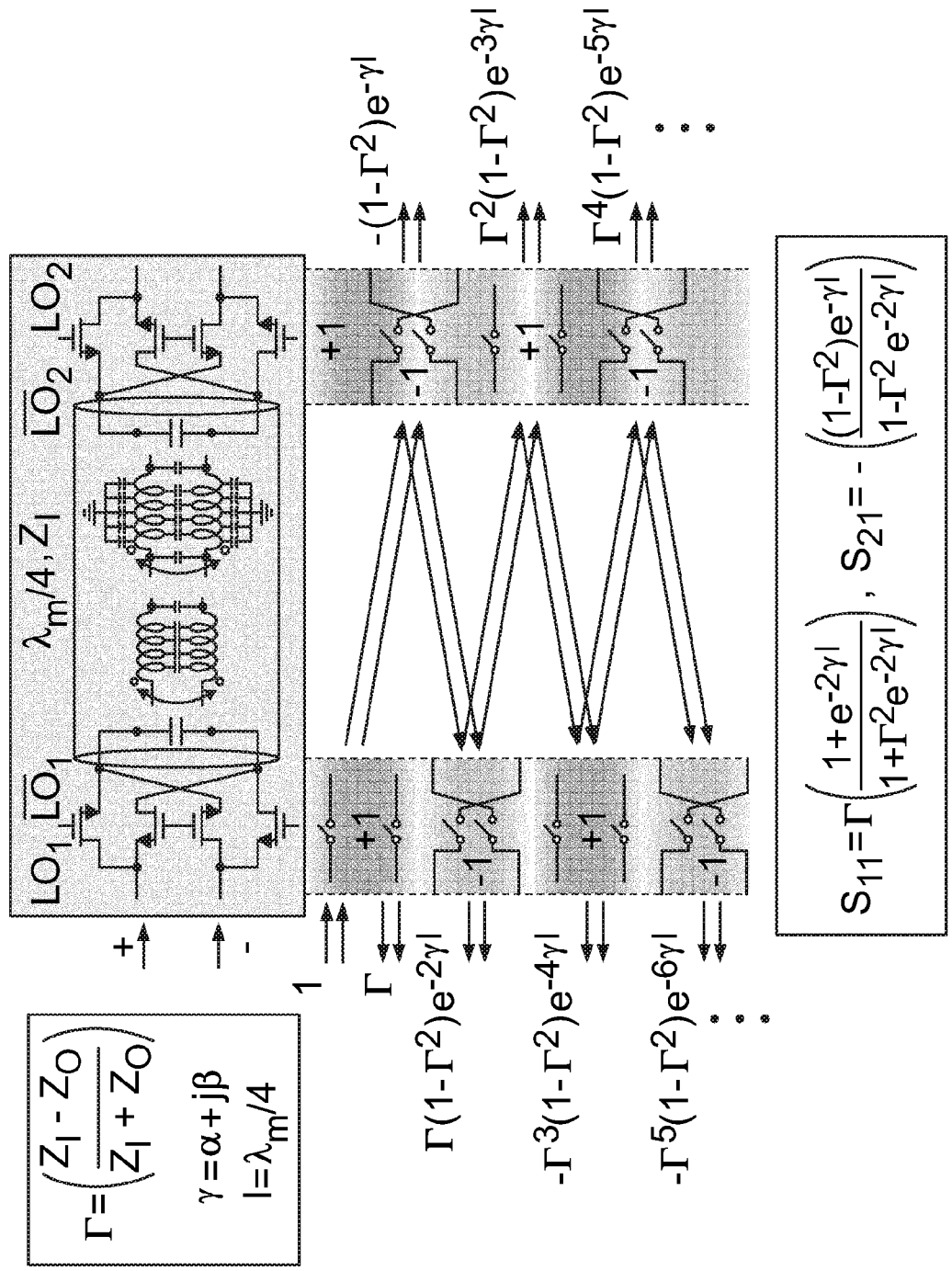
FIG. 23 illustrates another example of the cancellation of reflections in a gyrator with an impedance mismatch in accordance with some embodiments.

As illustrated in FIGS. 18-24, the matching of the gyrator structure at the odd multiples of the modulation frequency will not be compromised by using a different impedance "Zg" for the transmission line in the gyrator. This happens in a very counter-intuitive way. As shown in FIGS. 19 and 23, when there is an impedance mismatch at odd multiples of the modulation frequency, multiple reflections at port 1 (between the Zo and Zg interface) and port 2 (between the Zg and Zo interface) add up in a destructive way leading to a perfect matching.

The $S_{11}$ parameter of the gyrator in FIG. 19 can be represented as:

$S_{11}=-\Gamma-\Gamma(1+\Gamma)(1-\Gamma)e^{-2\gamma l}+\Gamma^3(1+\Gamma)(1-\Gamma)e^{-4\gamma l}-\Gamma^5(1+\Gamma)(1-\Gamma)e^{-6\gamma l}+\Gamma^7(1+\Gamma)(1-\Gamma)e^{-8\gamma l}\ldots$ This reduces to:

$$S_{11} = -\Gamma\left(\frac{1+e^{-2\gamma l}}{1+\Gamma^2 e^{-2\gamma l}}\right)$$

Similarly, the $S_{21}$ parameter of the gyrator in FIG. 19 can be represented as:

$$S_{21} = \left(\frac{(1-\Gamma^2)e^{-\gamma l}}{1+\Gamma^2 e^{-2\gamma l}}\right)$$

For a lossless case $\gamma=j\beta$ when $$\beta l = \frac{(2N+1)\pi}{2},$$

N=0, 1, 2, 3, . . .

$S_{11}=0$; $S_{21}=(-1)^N$

Similarly:

$S_{12}=(-1)^{N+1}j$; $S_{22}=0$

Thus, changing Zg does not affect the operation at center frequency and the structure acts as a gyrator for an Zg.

However, as shown in FIGS. 20, 21, 22, and 24, the contrast between the impedances "Zg/Zo" determines the bandwidth of this matching. For example, theoretically, the gyrator is matched over infinite bandwidth when Zg=Zo (as shown in the top row of the table of FIG. 22 where Zg=Zo=50 ohms). However, decreasing values of Zg will result in decreasing bandwidths as shown for example in FIG. 22 (which is for a modulation frequency of 10 GHz). That is, for each lower value of Zg and each higher center frequency in the table of FIG. 22, the Q value (which equals the center frequency (in the column heading) divided by 3 dB bandwidth) gets worse.

Figure 20:
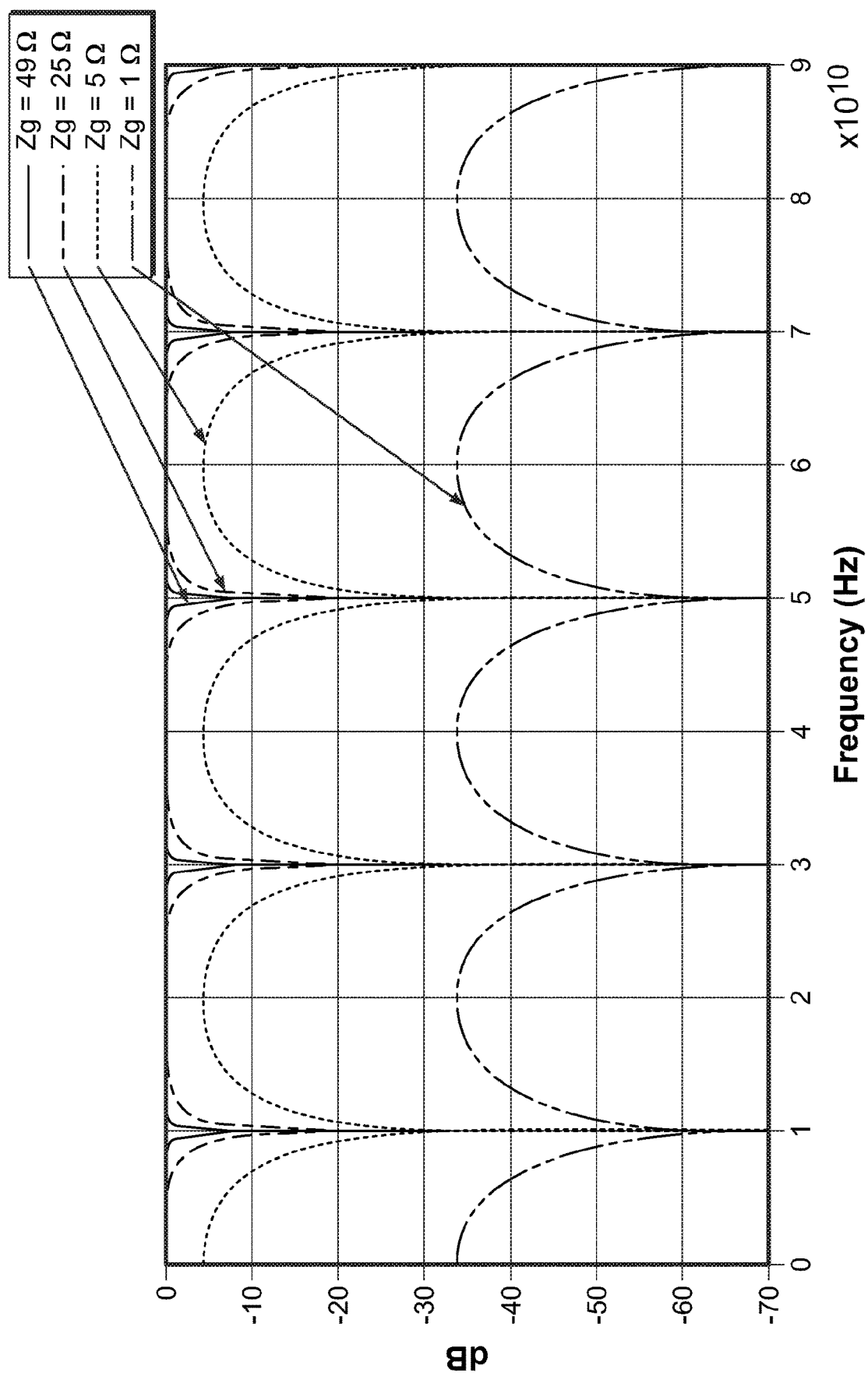
FIG. 20 illustrates an example of S11 parameters for a gyrator with an impedance mismatch in accordance with some embodiments.

As shown in FIG. 20, the S11 parameter for the gyrator of FIG. 19 at a modulation frequency of 10 GHz shows no reflections (or virtually no reflections) at odd multiples of the modulation frequency (i.e., 10 GHz, 30 GHz, 50 GHz, 70 GHz, and 90 GHz), and strong reflections at other frequencies.

Figure 21:
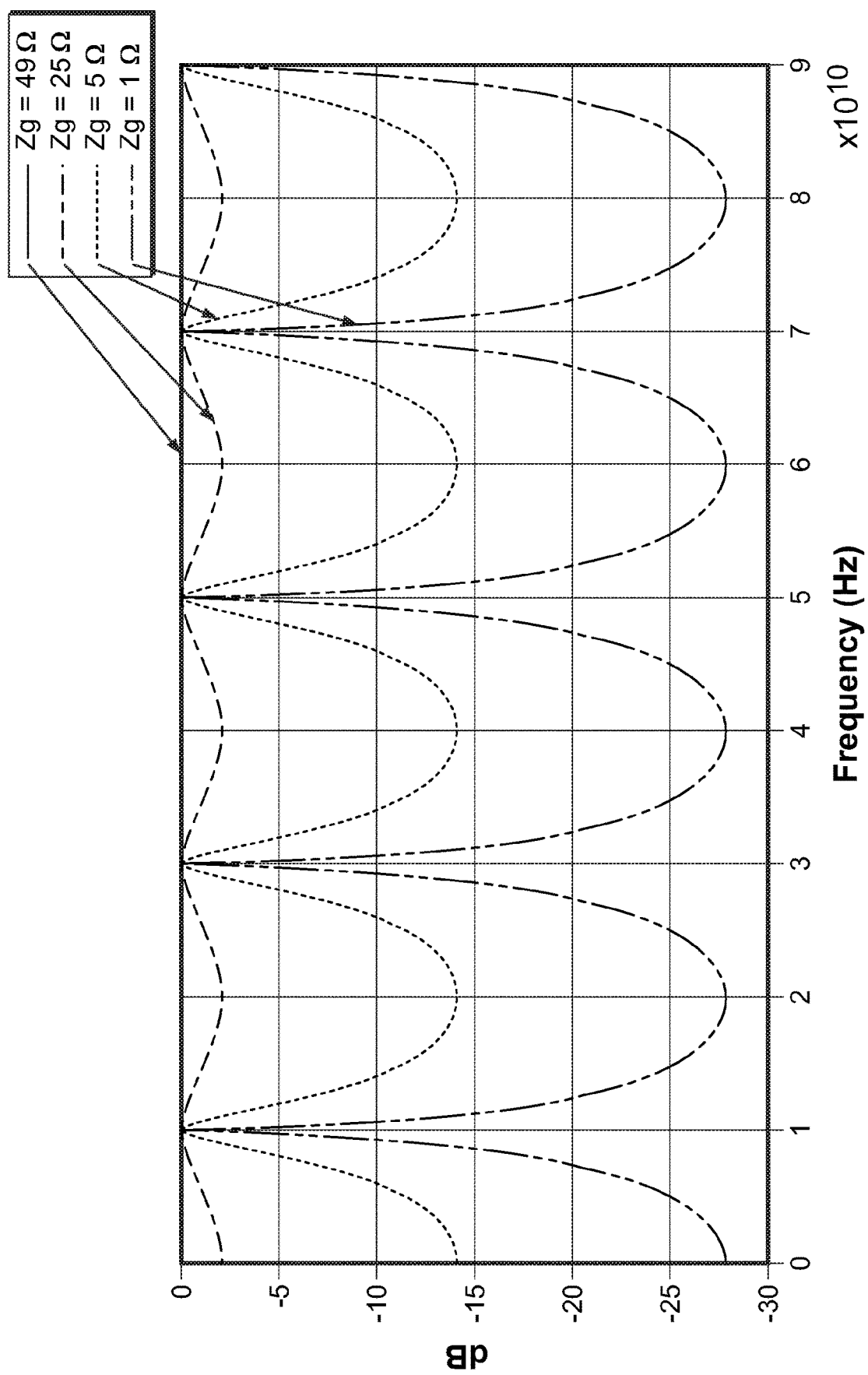
FIG. 21 illustrates an example of S21 parameters for a gyrator with an impedance mismatch in accordance with some embodiments.
Figure 24:
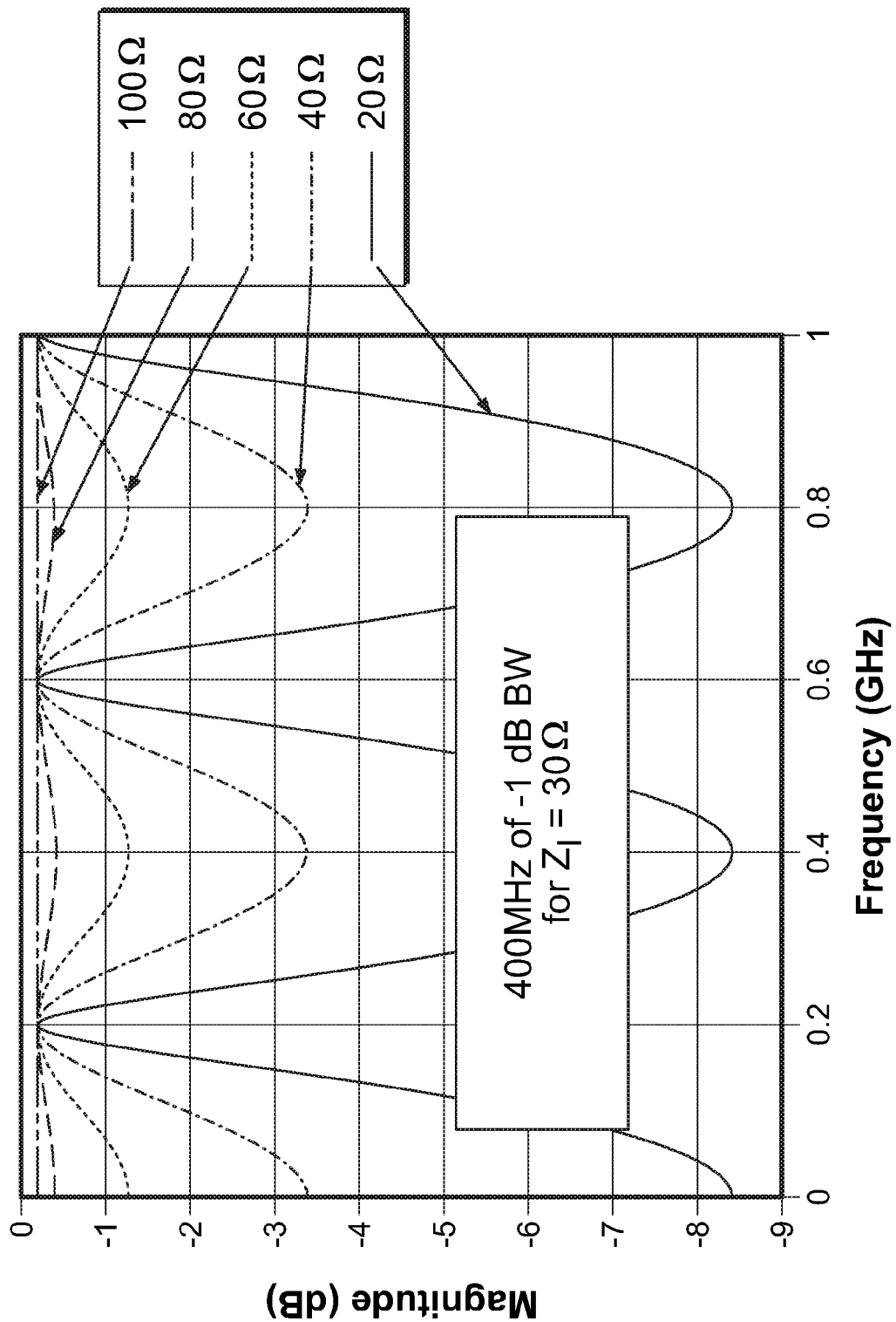
FIG. 24 illustrates another example of S21 parameters for a gyrator with an impedance mismatch in accordance with some embodiments.

As shown in FIG. 21, the S21 parameter for the gyrator of FIG. 19 at a modulation frequency of 10 GHz shows no attenuation (or virtually no attenuation) at Zg equal to 49 ohms (whose line is straight across at 0 dB), and progressively larger attenuations at lower Zg impedances of 25 ohms, 5 ohms, and 1 ohm other than when at odd multiples of the modulation frequency (i.e., 10 GHz, 30 GHz, 50 GHz, 70 GHz, and 90 GHz), where there is no attenuation (or virtually no attenuation). Similarly, as shown in FIG. 24, the S21 parameter for the gyrator of FIG. 23 at a modulation frequency of 200 MHz shows no attenuation (or virtually no attenuation) at Zg equal to 100 ohms (whose line is straight across at 0 dB), and progressively larger attenuations at lower Zg impedances of 80 ohms, 60 ohms, 40 ohms, and 20 ohms other than when at odd multiples of the modulation frequency (i.e., 20 GHz, 30 GHz, 50 GHz, 70 GHz, and 90 GHz), where there is no attenuation (or virtually no attenuation).

In a circulator implementation in accordance with some embodiments, a 60 ohm differential transmission line can be used. For these embodiments, the −1 dB bandwidth of the gyrator can be 400 MHz, while the −1 dB bandwidth of the circulator is 200 MHz. Since the bandwidth of the gyrator is greater than the bandwidth of the circulator, the usage of mismatched transmission line does not affect the bandwidth of the circulator in these embodiments.

In some embodiments, a 60 ohm transmission line that is a quarter wave at 200 MHz can be used. A comparable transmission line with the similar chip area could be 100 ohm and a quarter wave at 333 MHz. Hence by compromising the bandwidth of the gyrator, the modulation frequency can be reduced to 200 MHz from 333 MHz. As a result of this, the power consumption of the switches can be reduced by 40% when used in a circulator built at 1 GHz. It is important to notice that, even if a gyrator is infinitely broadband, a circulator built using this gyrator is not infinitely broadband. So slightly relaxing the bandwidth of the gyrator should not compromise the bandwidth of the circulator built using the gyrator with a 60 ohm transmission line.

If one chooses, a transmission line can be implemented with a much lower characteristic impedance, consequently the modulation frequency, and the lower limit will be determined by the minimum bandwidth required by the system and additional loss added in the gyrator due to multiple reflections as shown in FIGS. 20, 21, 22, and 24.

Although single transmission lines are illustrated herein as having certain delays, such transmission lines can be implemented as two or more transmission lines having the same total delay.

Although the disclosed subject matter has been described and illustrated in the foregoing illustrative implementations, it is understood that the present disclosure has been made only by way of example, and that numerous changes in the details of implementation of the disclosed subject matter can be made without departing from the spirit and scope of the disclosed subject matter, which is limited only by the claims that follow. Features of the disclosed implementations can be combined and rearranged in various ways.

What is claimed is:

1. A circuit, comprising:
a first differential transmission line having: a first end having a first connection and a second connection; and a second end having a third connection and a fourth connection;
a first switch having a first side, a second side, and a control, wherein the first side of the first switch is connected to the first connection;
a second switch having a first side, a second side, and a control, wherein the first side of the second switch is connected to the first connection;
a third switch having a first side, a second side, and a control, wherein the first side of the third switch is connected to the second connection and the second side of the third switch is connected to the second side of the first switch and a first node;
a fourth switch having a first side, a second side, and a control, wherein the first side of the fourth switch is connected to the second connection and the second side of the fourth switch is connected to the second side of the second switch and a second node;
a fifth switch having a first side, a second side, and a control, wherein the first side of the fifth switch is connected to the third connection;
a sixth switch having a first side, a second side, and a control, wherein the first side of the sixth switch is connected to the third connection;
a seventh switch having a first side, a second side, and a control, wherein the first side of the seventh switch is connected to the fourth connection and the second side of the seventh switch is connected to the second side of the fifth switch and a third node;
an eighth switch having a first side, a second side, and a control, wherein the first side of the eighth switch is connected to the fourth connection and the second side of the eighth switch is connected to the second side of the sixth switch and a fourth node; and
at least one boosting circuit that, in response to a modulation signal drives the control of at least one of the control of the first switch, the control of the second switch, the control of the third switch, the control of the fourth switch, the control of the fifth switch, the control of the sixth switch, the control of the seventh switch, and the control of the eighth switch with a drive signal.

2. The circuit of claim 1, further comprising:
a second differential transmission line having: a first end having a fifth connection and a sixth connection; and a second end having a seventh connection and an eighth connection;
a ninth switch having a first side, a second side, and a control, wherein the first side of the ninth switch is connected to the fifth connection;
a tenth switch having a first side, a second side, and a control, wherein the first side of the tenth switch is connected to the fifth connection;
an eleventh switch having a first side, a second side, and a control, wherein the first side of the eleventh switch is connected to the sixth connection and the second side of the eleventh switch is connected to the second side of the ninth switch and the first node;
a twelfth switch having a first side, a second side, and a control, wherein the first side of the twelfth switch is connected to the sixth connection and the second side of the twelfth switch is connected to the second side of the tenth switch and the second node;
a thirteenth switch having a first side, a second side, and a control, wherein the first side of the thirteenth switch is connected to the seventh connection;
a fourteenth switch having a first side, a second side, and a control, wherein the first side of the fourteenth switch is connected to the seventh connection;
a fifteenth switch having a first side, a second side, and a control, wherein the first side of the fifteenth switch is connected to the eighth connection and the second side of the fifteenth switch is connected to the second side of the thirteenth switch and the third node; and
a sixteenth switch having a first side, a second side, and a control, wherein the first side of the sixteenth switch is connected to the eighth connection and the second side of the sixteenth switch is connected to the second side of the fourteenth switch and the fourth node.

3. The circuit of claim 1, further comprising:
at least one other differential transmission line having a total delay of three quarters of a period of an operating frequency of the circuit, having a first side having a ninth connection and a tenth connection, and having a second side having an eleventh connection and a twelfth connection, wherein the ninth connection is connected to the second side of the first switch, the tenth connection is connected to the second side of the fourth switch, the eleventh connection is connected to the second side of the fifth switch, and the twelfth connection is connected to the second side of the eighth switch.

4. The circuit of claim 3, wherein the at least one other differential transmission line comprises:
- a third differential transmission line having a delay of one quarter of the period of the operating frequency of the circuit;
- a fourth differential transmission line having a delay of one quarter of the period of the operating frequency of the circuit; and
- at least one fifth differential transmission line having a total delay of one quarter of the period of the operating frequency of the circuit,
- wherein the third differential transmission line, the fourth differential transmission line, and the at least one fifth differential transmission line form a series connection between: the first node and the second node; and the third node and the fourth node.

5. The circuit of claim 4, further comprising a transmitter port, an antenna port, and a receiver port, wherein the third differential transmission line is connected between the transmitter port and the antenna port, and the fourth differential transmission line is connected between the antenna port and the receiver port.

6. The circuit of claim 4, wherein the at least one fifth differential transmission line comprises:
- a sixth differential transmission line having a delay of one eighth of the period of the operating frequency of the circuit; and
- a seventh differential transmission line having a delay of one eighth of the period of the operating frequency of the circuit,
- wherein the sixth differential transmission line is connected between the third differential transmission line and the third node and the fourth node, and the seventh differential transmission line is connected between the fourth differential transmission line and the third node and the fourth node.

7. The circuit of claim 1, wherein the control of the first switch and the control of the fourth switch are connected to a first local oscillator signal, the control of the second switch and the control of the third switch are connected to a second local oscillator signal, the control of the fifth switch and the control of the eighth switch are connected to a third local oscillator signal, and the control of the sixth switch and the control of the seventh switch are connected to a fourth oscillator signal.

8. The circuit of claim 7, wherein the first oscillator signal and the second oscillator signal are 180 degrees out of phase, the third oscillator signal and the fourth oscillator signal are 180 degrees out of phase, and the third oscillator signal is delay from the first oscillator signal by one quarter of a period of an operating frequency of the circuit.

9. The circuit of claim 8, wherein the first local oscillator, the second local oscillator, the third local oscillator, and the fourth local oscillator each have a 50% duty cycle.

10. The circuit of claim 1, wherein the first differential transmission line has a delay of one quarter of a period of an operating frequency of the circuit.

11. The circuit of claim 1, wherein the first differential transmission line is implemented as at least one C-L-C pi-type lumped section.

12. The circuit of claim 1, wherein the boosting circuit includes: a first plurality of switches and a first capacitor that are configured to charge the first capacitor when the boosting circuit is in a first state and to add a voltage across the first capacitor to the modulation signal to produce the drive signal when the boosting circuit is in a second state.

13. The circuit of claim 12, wherein the boosting circuit also includes: a second plurality of switches and a second capacitor that are configured to charge the second capacitor when the boosting circuit is in the second state and to add a voltage across the second capacitor to the modulation signal to produce the drive signal when the boosting circuit is in the first state.

14. The circuit of claim 13, wherein the second plurality of switches comprises:
- a seventeenth switch having a first side, a second side, and a control;
- an eighteenth switch having a first side, a second side, and a control, where the first side of the eighteenth switch is connected to the second side of the seventeenth switch and to a first side of the second capacitor, and wherein the second side of the eighteenth switch is connected to a positive voltage source;
- a nineteenth switch having a first side, a second side, and a control, where the first side of the nineteenth switch is connected to the second side of the second capacitor, and wherein the second side of the nineteenth switch is connected to a negative voltage source; and
- a twentieth switch having a first side, a second side, and a control, where the first side of the twentieth switch is connected to the second side of the second capacitor.

15. The circuit of claim 12, wherein the first plurality of switches comprises:
- a twenty first switch having a first side, a second side, and a control;
- an twenty second switch having a first side, a second side, and a control, where the first side of the twenty second switch is connected to the second side of the twenty first switch and to a first side of the first capacitor, and wherein the second side of the twenty second switch is connected to a negative voltage source;
- a twenty third switch having a first side, a second side, and a control, where the first side of the twenty third switch is connected to the second side of the first capacitor, and wherein the second side of the twenty third switch is connected to a positive voltage source; and
- a twenty fourth switch having a first side, a second side, and a control, where the first side of the twenty fourth switch is connected to the second side of the first capacitor.

16. The circuit of claim 1, wherein the boosting circuit includes: a second plurality of switches and a second capacitor that are configured to charge the second capacitor when the boosting circuit is in a second state and to add a voltage across the second capacitor to the modulation signal to produce the drive signal when the boosting circuit is in a first state.

17. The circuit of claim 16, wherein the second plurality of switches comprises:
- a seventeenth switch having a first side, a second side, and a control;
- an eighteenth switch having a first side, a second side, and a control, where the first side of the eighteenth switch is connected to the second side of the seventeenth switch and to a first side of the second capacitor, and wherein the second side of the eighteenth switch is connected to a positive voltage source;

a nineteenth switch having a first side, a second side, and a control, where the first side of the nineteenth switch is connected to the second side of the second capacitor, and wherein the second side of the nineteenth switch is connected to a negative voltage source; and a twentieth switch having a first side, a second side, and a control, where the first side of the twentieth switch is connected to the second side of the second capacitor.

* * * * *